United States Patent
Ohmi et al.

(10) Patent No.: US 7,795,106 B2
(45) Date of Patent: Sep. 14, 2010

(54) SEMICONDUCTOR DEVICE FORMED ON (111) SURFACE OF A SI CRYSTAL AND FABRICATION PROCESS THEREOF

(75) Inventors: Tadahiro Ohmi, 1-17-301, Komegafukuro 2-chome, Aoba-Ku, Sendai-Shi, Miyagi 980-0813 (JP); Shigetoshi Sugawa, Sendai (JP); Katsuyuki Sekine, Sendai (JP); Yuji Saito, Sendai (JP)

(73) Assignees: Tadahiro Ohmi, Miyagi (JP); Tokyo Electron Limited, Tokyo (JP)

(*) Notice: Subject to any disclaimer, the term of this patent is extended or adjusted under 35 U.S.C. 154(b) by 208 days.

(21) Appl. No.: 11/907,348

(22) Filed: Oct. 11, 2007

(65) Prior Publication Data
US 2008/0224145 A1   Sep. 18, 2008

Related U.S. Application Data

(62) Division of application No. 10/986,778, filed on Nov. 15, 2004, and a division of application No. 09/866,576, filed on May 29, 2001, now Pat. No. 7,012,311.

(51) Int. Cl.
H01L 21/76 (2006.01)
(52) U.S. Cl. .................. 438/424; 438/425; 438/435
(58) Field of Classification Search ............... 438/424, 438/425, 435
See application file for complete search history.

(56) References Cited

U.S. PATENT DOCUMENTS

| | | | |
|---|---|---|---|
| 4,027,320 A | 5/1977 | Jacobs et al. | |
| 4,143,388 A | 3/1979 | Esaki et al. | |
| 6,034,418 A | 3/2000 | Matsuura | |
| 6,034,430 A | 3/2000 | Hamburgen et al. | |
| 6,117,749 A | 9/2000 | Aronowitz et al. | |
| 6,151,240 A | 11/2000 | Suzuki | |
| 6,208,030 B1 | 3/2001 | Tsui et al. | |
| 6,278,138 B1 | 8/2001 | Suzuki | |
| 6,306,734 B1 | 10/2001 | Givargizov | |
| 6,355,580 B1 | 3/2002 | Li et al. | |
| 6,368,941 B1* | 4/2002 | Chen et al. | 438/424 |
| 6,420,764 B1 | 7/2002 | Blanchard | |
| 6,429,496 B1 | 8/2002 | Li et al. | |
| 6,436,748 B1 | 8/2002 | Forbes et al. | |

(Continued)

FOREIGN PATENT DOCUMENTS

JP   59-013335   1/1984

(Continued)

OTHER PUBLICATIONS

Foreign Office Action dated Feb. 12, 2009.

(Continued)

*Primary Examiner*—Long Pham
(74) *Attorney, Agent, or Firm*—Pillsbury Winthrop Shaw Pittman, LLP

(57) ABSTRACT

A semiconductor device includes a Si crystal having a crystal surface in the vicinity of a (111) surface, and an insulation film formed on said crystal surface, at least a part of said insulation film comprising a Si oxide film containing Kr or a Si nitride film containing Ar or Kr.

1 Claim, 17 Drawing Sheets

U.S. PATENT DOCUMENTS

| | | |
|---|---|---|
| 6,445,043 B1 | 9/2002 | Chittipeddi |
| 6,541,393 B2 | 4/2003 | Sugizaki et al. |
| 6,586,792 B2 | 7/2003 | Ahn et al. |
| 2002/0036320 A1 | 3/2002 | Ichimori et al. |

FOREIGN PATENT DOCUMENTS

| | | |
|---|---|---|
| JP | 11-204512 | 7/1999 |
| JP | 2000-228522 | 8/2000 |
| WO | WO 98/33362 | 7/1998 |

OTHER PUBLICATIONS

Stephen A. Campbell, The Science and Engineering of Microelectric Fabrication, Oxford University Press, pp. 29-31 and 394-396, (1996).

* cited by examiner

SEMICONDUCTOR DEVICE FORMED ON (111) SURFACE OF A SI CRYSTAL AND FABRICATION PROCESS THEREOF

CROSS REFERENCE TO RELATED APPLICATIONS

The present application is a divisional of U.S. patent application Ser. No. 10/986,778 filed on Nov. 15, 2004 and U.S. patent application Ser. No. 09/866,576 filed on May 29, 2001 (now U.S. Pat. No. 7,012,311) for which priority is claimed under 35 U.S.C. §120. This application is also based on Patent Application No. 11-376170 filed in Japan on Nov. 30, 1999. The entire contents of each of these applications are herein fully incorporated by reference.

BACKGROUND OF THE INVENTION

The present invention generally relates to semiconductor devices and more particularly to a semiconductor device formed on a (111) surface of a Si crystal and fabrication process thereof.

A gate insulation film of a MIS (metal/semiconductor/Si) transistor is subjected to various stringent requirements with regard to electric properties, including low leakage current, small surface state density, large hotcarrier resistance, and the like. Further, such a gate insulation film is required to provide high reliability. In order to meet for these stringent demands, it has been practiced conventionally to form the gate insulation film by a thermal oxidation of a Si substrate surface at a temperature of 800° C. or more.

However, a satisfactory oxide film that satisfies the requirements with regard to interface characteristics of the oxide/Si substrate interface, breakdown characteristics, and leakage current characteristics, is obtained only when the surface of the Si substrate has a (100) orientation as far as thermal oxidation process is used. When a thermal oxidation process is applied to a Si substrate having a surface orientation other than the (100) surface for forming a gate oxide film, there arises various problems in the gate oxide film such as increased surface state density at the oxide/Si substrate interface as compared with case of forming the Si oxide film on the (100)-oriented Si substrate. Further, the oxide film thus formed suffers from the problem of poor breakdown voltage characteristics or poor leakage current characteristics.

With regard to mobility, a MIS transistor shows a large mobility when formed on the (100)-oriented Si substrate. On the other hand, it is not possible to form a MIS transistor having a large driving power on a Si substrate having a different surface orientation.

Meanwhile, there is a need of introducing a metal material into a semiconductor substrate in high-speed semiconductor devices operable with a clock rate of about 10 GHz, for realizing attenuation-free signal transmission and cross-talk suppression. However, the use of high temperature process that requires a temperature of 550° C. or more in the device fabrication process raises the problem of deterioration of device performance caused by reaction between the metal layer and the semiconductor layer. Further, the use of high-temperature annealing process tends to facilitate diffusion of impurity elements introduced into the active region of the semiconductor layer, and there arises a difficulty in controlling the impurity distribution profile accurately. Thus, it has been necessary to avoid the use of thermal oxidation process conducted at the temperature of 800° C. or more in the fabrication process of highly miniaturized high-speed semiconductor devices.

Meanwhile, it is desirable to form a semiconductor device on a (111) surface of a Si crystal, in which Si atoms are arranged with a large surface density, in order to improve the driving power of the semiconductor device. Further, there is a demand of using a very thin gate insulation film having a dielectric constant larger than that of a Si oxide film. However, there has been no known process that enables formation of a high-quality high-dielectric film having a small surface state density and excellent electric property on a (111) surface of a Si crystal at low temperature.

In recent high-density semiconductor integrated circuits, it is generally practiced to form a shallow trench isolation (STI) structure on a Si substrate. In a semiconductor integrated circuit having such an STI structure, there arises a problem in that the thickness of an Si oxide film formed by a thermal oxidation process is tend to be reduced at the corner part of the device isolation groove as compared with the flat surface of the Si substrate. Associated therewith, the quality of the Si oxide film is deteriorated in such a corner part. Thus, there has been a reliability problem in the conventional semiconductor integrated circuit devices that uses an STI structure, such as degradation of leakage current characteristic or degradation of breakdown characteristic, particularly at the corner art of the STI structure. It is believed that the foregoing problem is caused by the (111) surface that appears at such a corner part of the device isolation groove when the device isolation groove is formed in an ordinary Si substrate having the (100) surface.

In order to avoid the foregoing problem, it has been practiced conventionally to form the STI structure such that the device isolation groove constituting the STI structure has a sidewall inclined with respect to the surface of the Si substrate with an angle of about 70 degrees or less. In other words, it has been practiced to provide a taper angle to the device isolation groove of the STI structure for minimizing the thinning of the Si oxide film at the corner part of the device isolation groove. In spite of such a measure, however, it has not been successful to suppress the degree of decrease of the film thickness below about 30%, and thus, the problem of increased leakage current or degradation of breakdown characteristic of the oxide film in the thinned part thereof has not been overcome. Further, the device having such a tapered device isolation groove has a drawback of increased width of the device isolation groove, and associated problem of reduced effective area on which semiconductor devices such as a transistor are formed. Thereby, increase of integration density of the semiconductor integrated circuit device has been impeded.

A polysilicon film formed on an insulation film shows a tendency that the Si crystals therein are oriented generally in the <111> direction. As long as conventional thermal oxidation process is used, it has been difficult to form a high-quality silicon gate oxide film on such a polysilicon film having the preferred orientation in the <111> direction. Thus, it has been difficult to form a high-speed semiconductor device of short gate length on a Si substrate formed on an insulation film such as a polysilicon film, and thus, it has been difficult to realize a three-dimensional integrated circuit by stacking a number of insulation films each carrying a semiconductor device.

SUMMARY OF THE INVENTION

Accordingly, it is a general object of the present invention to provide a novel and useful semiconductor device and fabrication process thereof wherein the foregoing problems are eliminated.

Another object of the present invention is to provide an insulation film forming technology capable of forming a high-quality insulation film on a (111) surface of a Si crystal at a low temperature below about 550° C., a fabrication process of a semiconductor device on a (111) surface of a Si crystal by using such a insulation film forming technology, and a semiconductor device fabricated according to such a fabrication process.

Another object of the present invention is to provide a semiconductor device, comprising a Si crystal having a (111) surface, and an insulation film formed on said (111) surface of said Si crystal, at least a part of said insulation film comprising a Si oxide film containing Kr.

Another object of the present invention is to provide a semiconductor device comprising a Si crystal having a (111) surface, and an insulation film formed on said (111) surface of said Si crystal, at least a part of said insulation film comprising a silicon nitride film containing Ar or Kr.

Another object of the present invention is to provide a semiconductor integrated circuit device, comprising at least one metal layer, a Si layer formed above said metal layer with an insulation film interposed therebetween, said Si layer having a (111) principal surface, and a plurality of transistors formed on said Si layer, at least a part of said insulation film formed on said silicon layer comprising a Si oxide film containing Kr.

Another object of the present invention is to provide a semiconductor integrated circuit, characterized by at least one metal layer, a Si layer formed above said metal layer with an insulation film interposed therebetween, said Si layer having a (111) principal surface, and a plurality of transistors formed on said Si layer, at least a part of an insulation film formed on said silicon layer comprising a silicon nitride film containing Ar or Kr.

According to the present invention, active atomic state oxygen O* are formed efficiently by activating $O_2$ in Kr plasma excited by a microwave. By causing the atomic state oxygen O* to react, it becomes possible to form a Si oxide film having a quality superior to a silicon thermal oxide film formed at about 1000° C. on the (111) surface of a Si crystal. By using the Si oxide film thus formed as a gate insulation film, it becomes possible to form a high-performance semiconductor device or a semiconductor integrated circuit device on the (111) surface of the Si crystal. The (111) surface of the Si crystal may be the one defining the principal surface of the Si single crystal substrate or the one formed in a part thereof. Further, the (111) surface may be the one appearing at the surface of a polysilicon film.

According to the present invention, active hydrogen nitride radicals NH* are formed efficiently by activating $NH_3$ or a mixed gas of $N_2$ and $H_2$ in microwave exited plasma of Ar or Kr. By causing the hydrogen nitride radicals $NH_3$* to react, it becomes possible to form a silicon nitride film having a quality superior to a silicon thermal oxide film formed at about 1000° C. on the (111) surface of a Si crystal at a low temperature of 550° C. or less. The silicon nitride film thus formed can be used as a high-dielectric gate insulation film and it becomes possible to form a high-performance semiconductor device or a high-performance semiconductor integrated circuit device on the (111) surface of the Si crystal. It should be noted that the (111) surface of the Si crystal may be the one defining the principal surface of a Si single crystal substrate or the one formed in a part thereof. Further, the (111) surface may be the one appearing at the surface of a polysilicon film.

According to the present invention, it becomes possible to form a high-quality Si oxide film or a silicon nitride film on the (111) surface formed at the corner part of the device isolation groove of an STI structure. As a result, it becomes possible to reduce the leakage current of the STI structure and the breakdown characteristic thereof without increasing the width of the device isolation groove. As a result, it becomes possible to improve the electric property and the reliability in the semiconductor device that has such an STI structure.

Further, the present invention is applicable also to semiconductor devices in which requirement of high film quality and stability is imposed to gate insulation film, such as a ferroelectric memory device or a flash memory device.

Further, the present invention enables formation of high-quality gate oxide film or gate nitride film on a Si film formed of Si crystals preferentially oriented in the <111> direction. Thus, it becomes possible to realize a polysilicon transistor or a thin film transistor having a large driving power. Further, it becomes possible to realize a three-dimensional integrated circuit device in which functional devices are stacked in plural layers.

DETAILED DESCRIPTION OF THE PREFERRED EMBODIMENTS

Principle

First, low temperature oxide film formation using plasma will be described.

Figure 2:
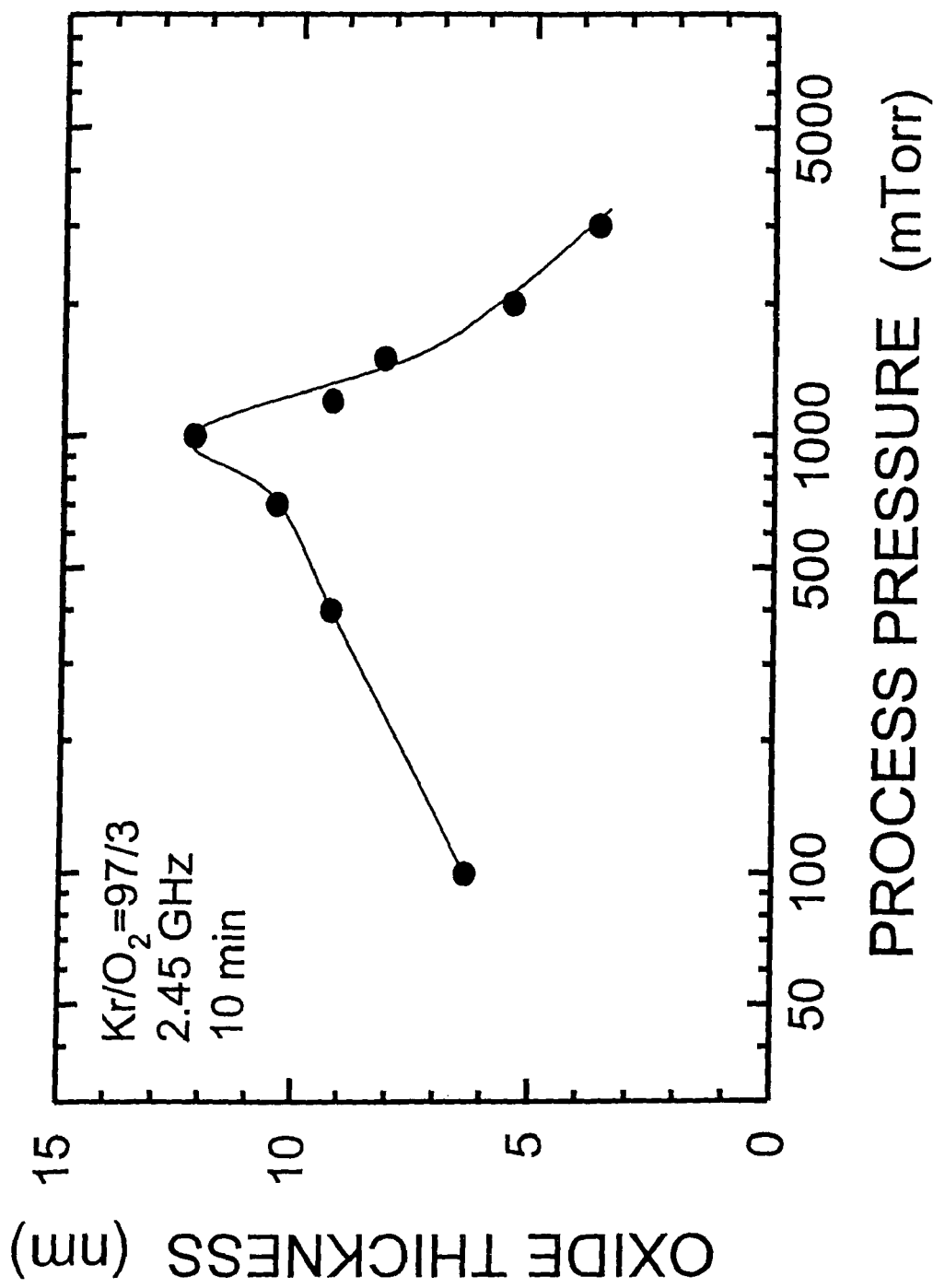
FIG. 2 is a diagram showing the relationship between the thickness of an oxide film formed by the plasma processing apparatus of FIG. 1 and the pressure of the processing chamber.

FIG. 2 is a cross-sectional diagram showing the construction of an exemplary microwave plasma processing apparatus used in the present invention for realizing the oxidation process, wherein the microwave plasma processing apparatus uses a radial line slot antenna (see WO98/33362). The novel feature of the present embodiment is to use Kr as the plasma excitation gas at the time of forming the oxide film.

Referring to FIG. 2, the microwave plasma processing apparatus includes a vacuum vessel (processing chamber) 101 accommodating therein a stage 104 on which a substrate 103 to be processed is supported. The processing chamber 101 is evacuated to a vacuum state, and a Kr gas and an $O_2$ gas are introduced from a shower plate 102 formed at a part of the wall of the processing chamber 101 such that the pressure inside the processing chamber is set to about 1 Torr (about 133 Pa). Further, a disk-shaped substrate such as a silicon wafer is placed on the stage 104 as the foregoing substrate 103. The stage 104 includes a heating mechanism, and the temperature of the substrate 103 is set to about 400° C. It is preferable to set the temperature in the range of 200-550° C. As long as the temperature is set in this range, a similar result is obtained.

Next, a microwave of 2.45 GHz is supplied from an external microwave source via a coaxial waveguide 105 connected thereto, wherein the microwave thus supplied is radiated into the processing chamber 101 by the radial line slot antenna 106 through a dielectric plate 107. As a result, there is formed high-density plasma in the processing chamber 101. As long as the frequency of 900 MHz or more but not exceeding 10 GHz is used for the microwave, a result similar to the one described below is obtained. In the illustrated example, the distance between the shower plate 102 and the substrate 103 is set to about 6 cm. Narrower the distance, faster the film forming process.

While the present embodiment shows the example of forming a film by using the plasma apparatus that uses the radial line slot antenna, it is also possible to introduce a microwave into the processing chamber by other means.

In the high-density plasma in which an Kr gas and an $O_2$ gas are mixed, Kr* at the intermediate excitation state cause collision with the $O_2$ molecules and there occurs efficient formation of atomic state oxygen O*, and the atomic state oxygen O* thus formed cause oxidation of the substrate surface. It should be noted that oxidation of a silicon surface has conventionally been conducted by using $H_2O$ or $O_2$ molecules at very high process temperature such as 800° C. or more. In the case of using atomic state oxygen, on the other hand, it becomes possible to carry out the oxidation process at a low temperature of 550° C. or less.

In order to increase the chance of collision between K* and $O_2$, it is preferable to increase the pressure in the processing chamber 101. On the other hand, the use of too high pressure in the processing chamber increases the chance that O* causing collision with another O* and returning to the $O_2$ molecule. Thus, there would exist an optimum gas pressure.

FIG. 2 shows the thickness of the oxide film for the case in which the total pressure inside the processing chamber 101 is changed while maintaining the Kr and oxygen pressure ration such that the proportion of Kr is 97% and the proportion of oxygen is 3%. In the experiment of FIG. 2, it should be noted that the silicon substrate was held at 400° C. and the oxidation was conducted over the duration of 10 minutes.

Referring to FIG. 2, it can be seen that the thickness of the oxide film becomes maximum when the total gas pressure in the processing chamber 101 is set to 1 Torr, indicating that the oxidation process becomes optimum under this pressure or in the vicinity of this pressure. Further, it should be noted that this optimum pressure remains the same in the case the silicon substrate has the (100) oriented surface and further in the case the silicon substrate has the (111) oriented surface.

Figure 3:
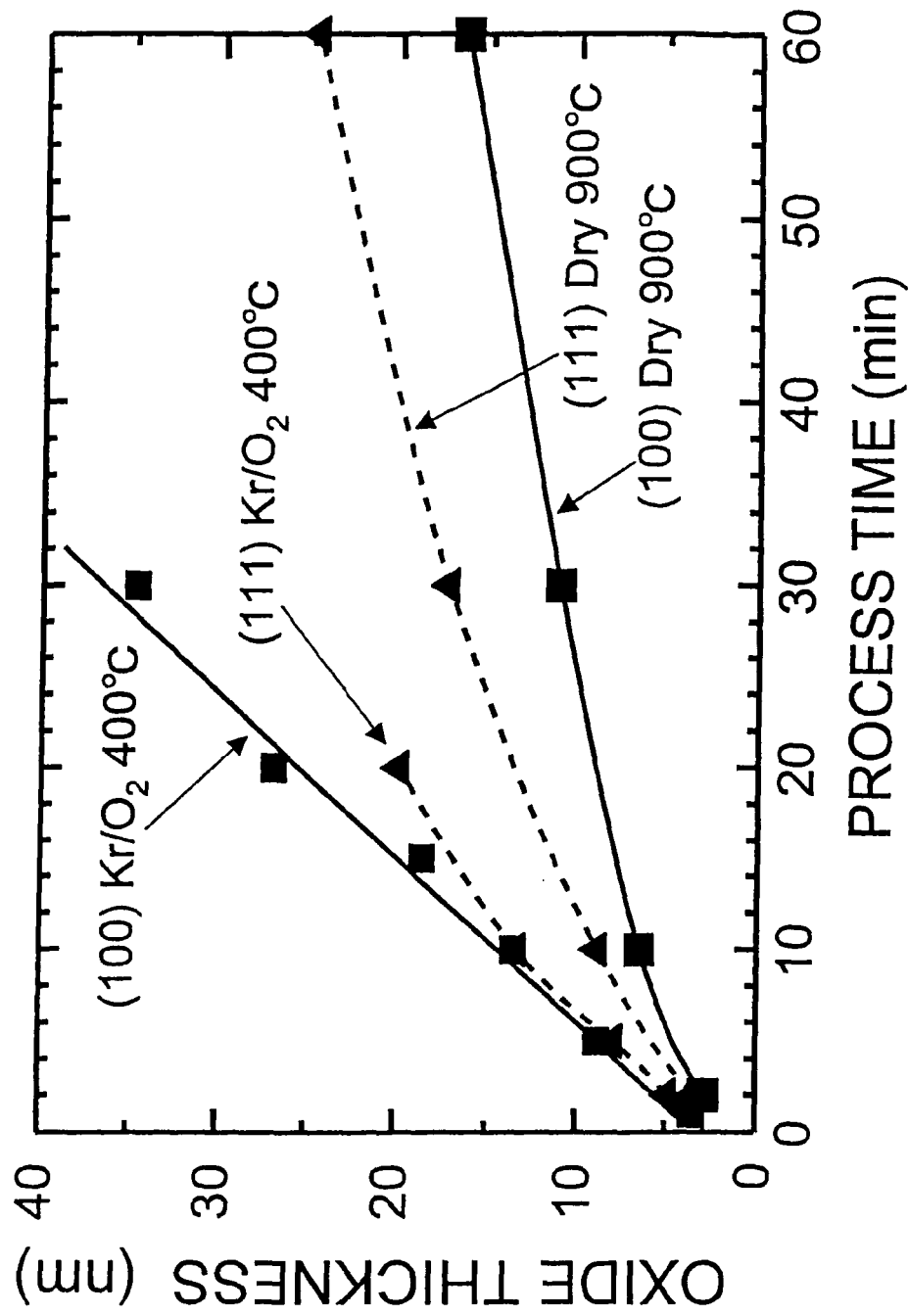
FIG. 3 is a diagram showing the relationship between the thickness of an oxide film formed by the plasma processing apparatus of FIG. 1 and the oxidation time.

FIG. 3 shows the relationship between the thickness of the oxide film and the duration of the oxidation processing for the oxide film that is formed by oxidation of the silicon substrate surface using the $Kr/O_2$ high-density plasma. In FIG. 3, the result for the case in which the silicon substrate has the (100) oriented surface and the result for the case in which the silicon substrate has the (111) oriented surface are both represented. Further, FIG. 3 also represents the oxidation time dependence for the case a conventional dry oxidation process at the temperature of 900° C. is employed.

Referring to FIG. 3, it can be seen that the oxidation rate caused by the $Kr/O_2$ high-density plasma oxidation processing, conducted at the temperature of 400° C. under the chamber pressure of 1 Torr, is larger than the oxidation rate of a dry $O_2$ process conducted at 900° C. under the atmospheric pressure.

From FIGS. 2 and 3, it can be seen that the productivity of the oxidation processing of the substrate surface is improved substantially by conducting oxidation of the silicon substrate surface by using the $Kr/O_2$ high-density plasma. In the conventional high-temperature thermal oxidation process, it should be noted that the $O_2$ molecules or $H_2O$ molecules in the atmosphere have to penetrate through the oxide film on the surface by diffusion in order that the $O_2$ molecules or the $H_2O$ molecules reach the silicon/Si oxide interface and cause an oxidation therein. Thus, the oxidation rate of the substrate surface has been controlled by the diffusion rate of the $O_2$ or $H_2O$ molecules through the oxide film. Because of this reason, it has been commonly accepted that the thickness of an oxide film would increase with time t according to the function of $t^{1/2}$. In the $Kr/O_2$ high-density plasma oxidation process of the present invention, on the other hand, it is noted that a constant oxidation rate is maintained up to the point in which the thickness of the oxide film reaches 35 nm and the oxide thickness increases linearly with time. This indicates that the atomic state oxygen O* have a very large diffusion rate in the Si oxide film and the atomic state oxygen O* can pass through the Si oxide film freely.

With regard to orientation dependence of oxide film thickness, the result of FIG. 3 indicates that, in the case of conventional dry thermal oxidation process at 900° C., the growth rate of the oxidation film is larger when the oxide film is formed on the (111) oriented silicon surface as compared with the case of forming the oxide film on the (100) oriented silicon surface. In the case in which the $Kr/O_2$ high-density plasma oxidation process is used, on the other hand, this relationship is reversed and the growth rate of the oxide film on the (111) surface becomes smaller than the growth rate of the oxide film on the (100) surface.

In view of the fact that silicon atoms are arranged in a Si substrate with larger surface density on the (111) oriented surface than on the (100) oriented surface, it is predicted that the oxidation rate should be smaller on the (111) surface than on the (100) surface as long as the supply rate of the oxygen radicals is the same. The result of the foregoing oxidation process of the silicon substrate surface is in good conformity with this prediction when the $Kr/O_2$ high-density plasma is used for the oxidation process, indicating that there is formed a dense oxide film similar to the one formed on a (100) surface, also on the (111) surface. In the conventional case, on the other hand, the oxidation rate of the (111) surface is much larger than the oxidation rate of the (100) surface. This indicates that the oxide film formed on the (111) film would be sparse in the film quality as compared with the oxide film formed on the (100) surface.

Figure 4:
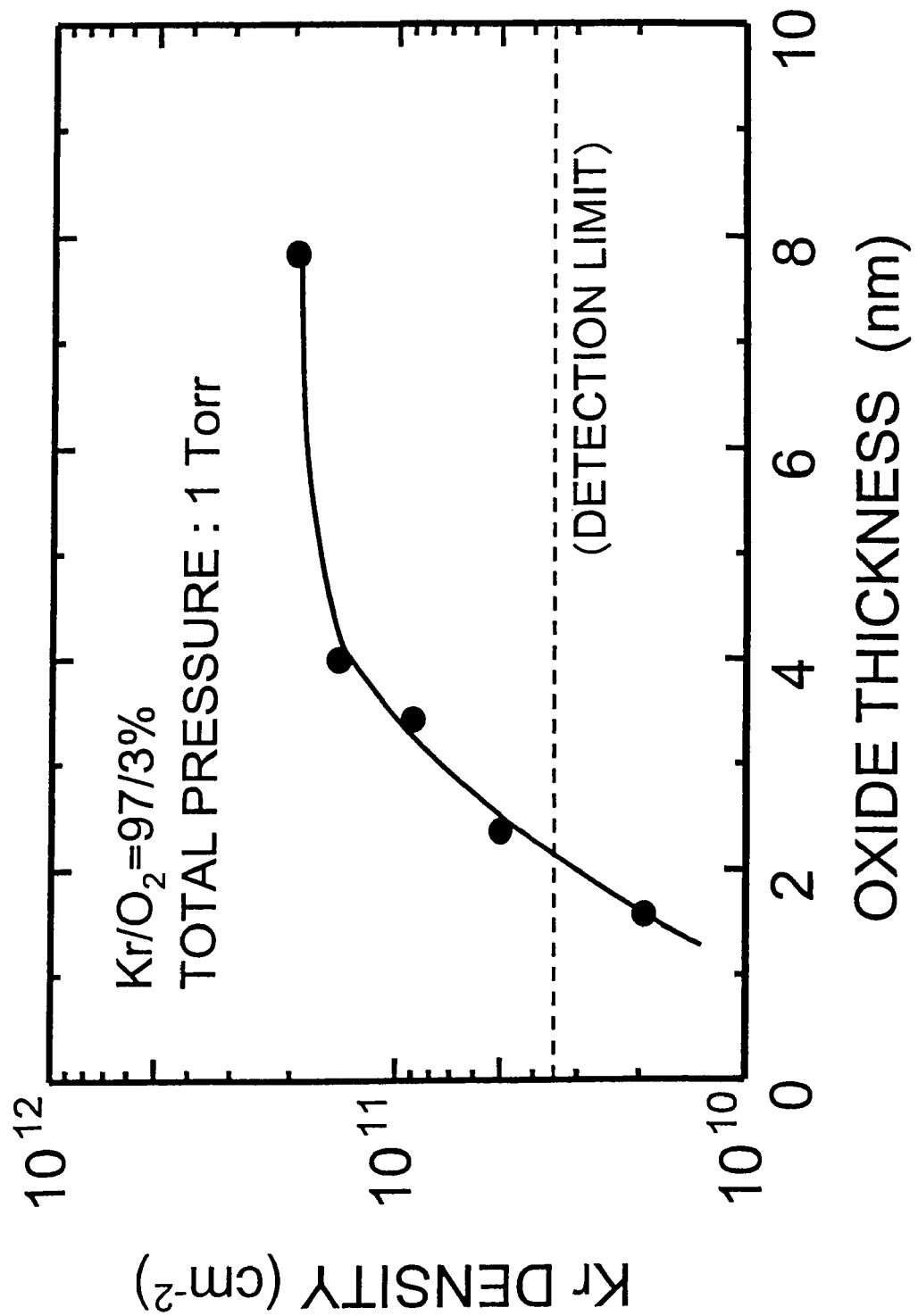
FIG. 4 is a diagram showing the depth profile of Kr concentration in the Si oxide film formed by the plasma processing apparatus of FIG. 1.

FIG. 4 shows the depth profile of the Kr density inside the silicon oxide film that is formed according to the foregoing process, wherein the depth profile FIG. 4 was obtained by a total-reflection fluorescent X-ray spectrometer. In the experiment of FIG. 4, the formation of the silicon oxide film was conducted at the substrate temperature of 400° C. while setting the oxygen partial pressure in the Kr gas to 3% and setting the pressure of the processing chamber to 1 Torr (about 133 Pa).

Referring to FIG. 4, it can be seen that the Kr density in the oxide film decreases with decrease of the film thickness and reaches a value of about $2\times10^{11}$ cm$^{-2}$ is at the surface of the silicon oxide film. Thus, the silicon oxide film thus formed has a uniform Kr concentration level in the film when the thickness is 4 nm or more. Further, the Kr concentration level decreases toward the silicon/Si oxide interface.

Figure 5:
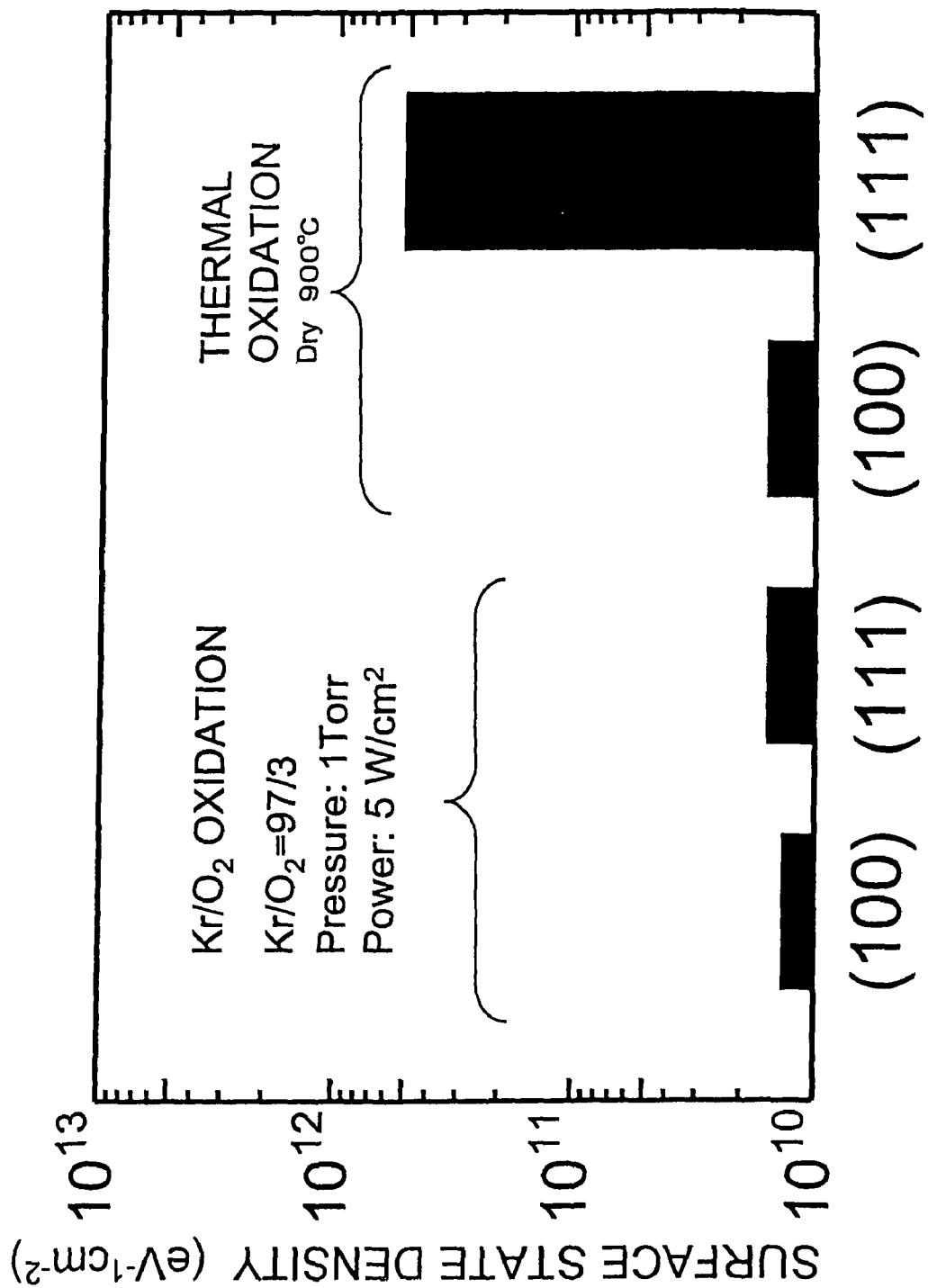
FIG. 5 is a diagram showing the surface state density in the Si oxide film formed by the plasma processing apparatus of FIG. 1.

FIG. 5 shows the surface state density of the oxide film thus formed, wherein the result of FIG. 5 was obtained by a low-frequency C-V measurement. The silicon oxide film was formed at the substrate temperature of 400° C. while using the apparatus of FIG. 1. In the experiment, the oxygen partial pressure in the rare gas was set to 3% and the pressure in the processing chamber was set to 1 Torr. For the sake of comparison, the surface state density of a thermal oxide film formed at 900° C. in a 100% $O_2$ atmosphere is also represented.

Referring to FIG. 5, it can be seen that the surface state density of the oxide film is small in both of the cases in which the oxide film is formed on the (100) surface and in which the oxide film is formed on the (111) surface as long as the oxide film is formed in the Kr plasma. The value of the surface state density thus achieved is comparable with the surface state density of a thermal oxide film formed on the (100) surface in a dry oxidation atmosphere at 900° C. Contrary to the foregoing, the thermal oxide film formed on the (111) surface has a surface state density much larger than the foregoing surface state density by a factor of ten.

The mechanism of the foregoing results may be the one described below.

Viewing a Si crystal surface from the side of an silicon oxide film during an oxidation process of the Si crystal, there appear two bonds for one silicon atom when the silicon surface is a (100) surface. On the other hand, there appear one bond and three bonds alternately for one silicon atom when the silicon surface is a (111) surface.

Thus, when a conventional thermal oxidation process is applied to a (111) surface, oxygen atoms quickly cause bonding to all the foregoing three bonds, leaving the remaining bond behind the silicon atom un-bonded. Thereby, the remaining bond may extend and form a weak bond or disconnected and form a dangling bond. When this is the case, there inevitably occurs an increase of surface state density. When the high-density plasma oxidation is conducted in the mixed gas of Kr and $O_2$, Kr* of the intermediate excitation state cause collision with $O_2$ molecules and there occurs efficient formation of atomic state oxygen O*, wherein the atomic state oxygen O* thus formed easily reach the weak bond or dangling bond noted before and form a new silicon-oxygen bond. With this, it is believed that the surface states are reduced also on the (111) surface.

Figure 1:
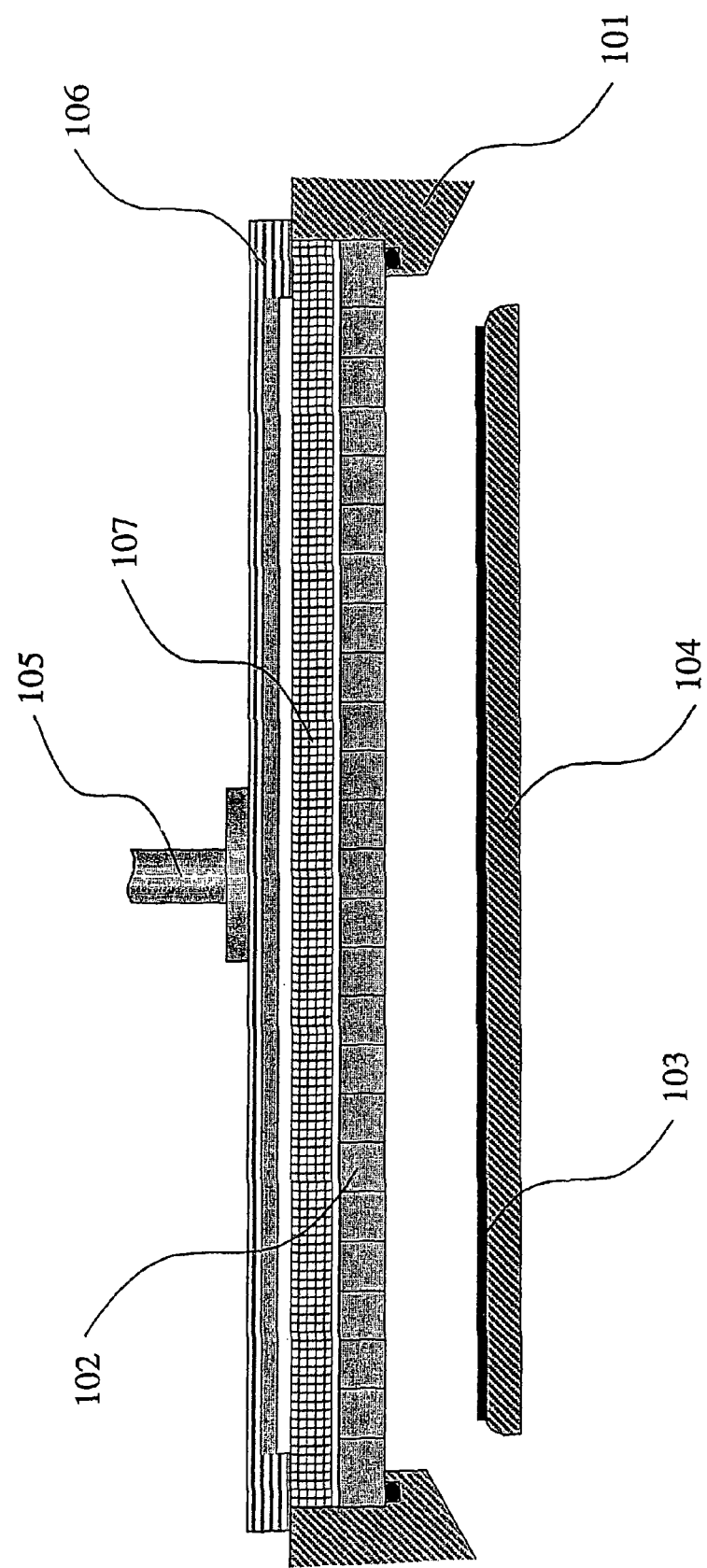
FIG. 1 is a diagram schematically showing the concept of a plasma processing apparatus that uses a radial line slot antenna.
Figure 6:
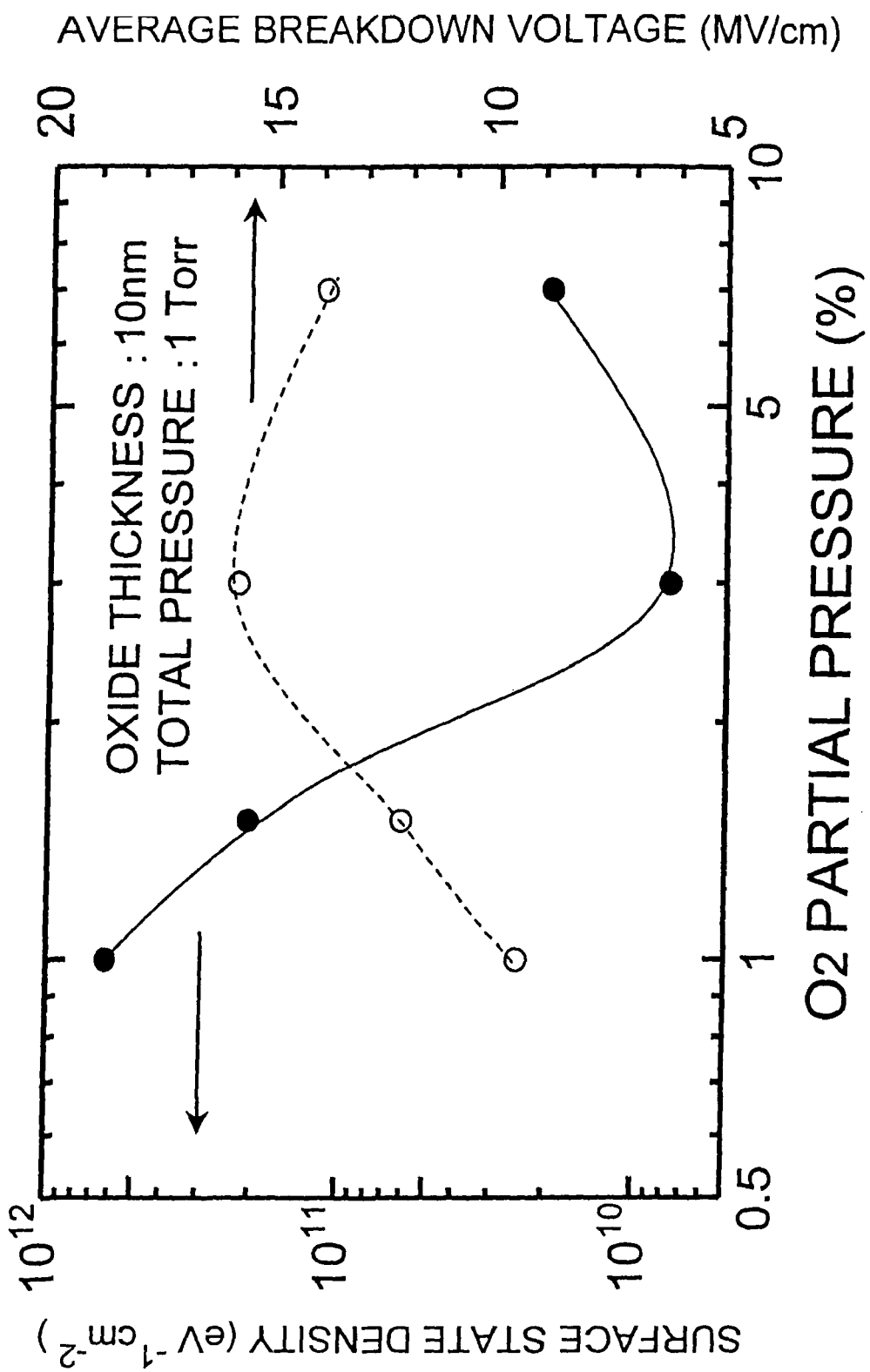
FIG. 6 is a diagram showing the relationship between the oxygen partial pressure in the atmosphere used in the plasma processing apparatus of FIG. 1 for forming an Si oxide film and the surface state density and breakdown voltage of the Si oxide film thus formed.

FIG. 6 shows a relationship between the $O_2$ partial pressure used in the substrate processing apparatus of FIG. 1 for forming the silicon oxide film and the breakdown voltage of the silicon oxide film thus formed. Further, FIG. 6 shows the relationship between the $O_2$ partial pressure and the surface state density of the silicon oxide film. In the experiment of FIG. 6, the pressure inside the processing chamber is set to 1 Torr. A similar relationship is obtained in the case the Si oxide film is formed on the (100) surface and in the case the silicon oxide film is formed on the (111) surface.

Referring to FIG. 6, it can be seen that the surface state density in the oxide film becomes minimum when the $O_2$ partial pressure is 3%, and a surface state density equivalent to the surface state density of a thermal oxide film is obtained. Further, it can be seen that the breakdown voltage of the Si oxide film becomes maximum in the vicinity of the oxygen partial pressure of 3%. From this, it is concluded that the oxygen partial pressure is preferably set to 2-4% when conducting a low-temperature plasma oxidation process by using the $Kr/O_2$ mixed gas.

Figure 7:
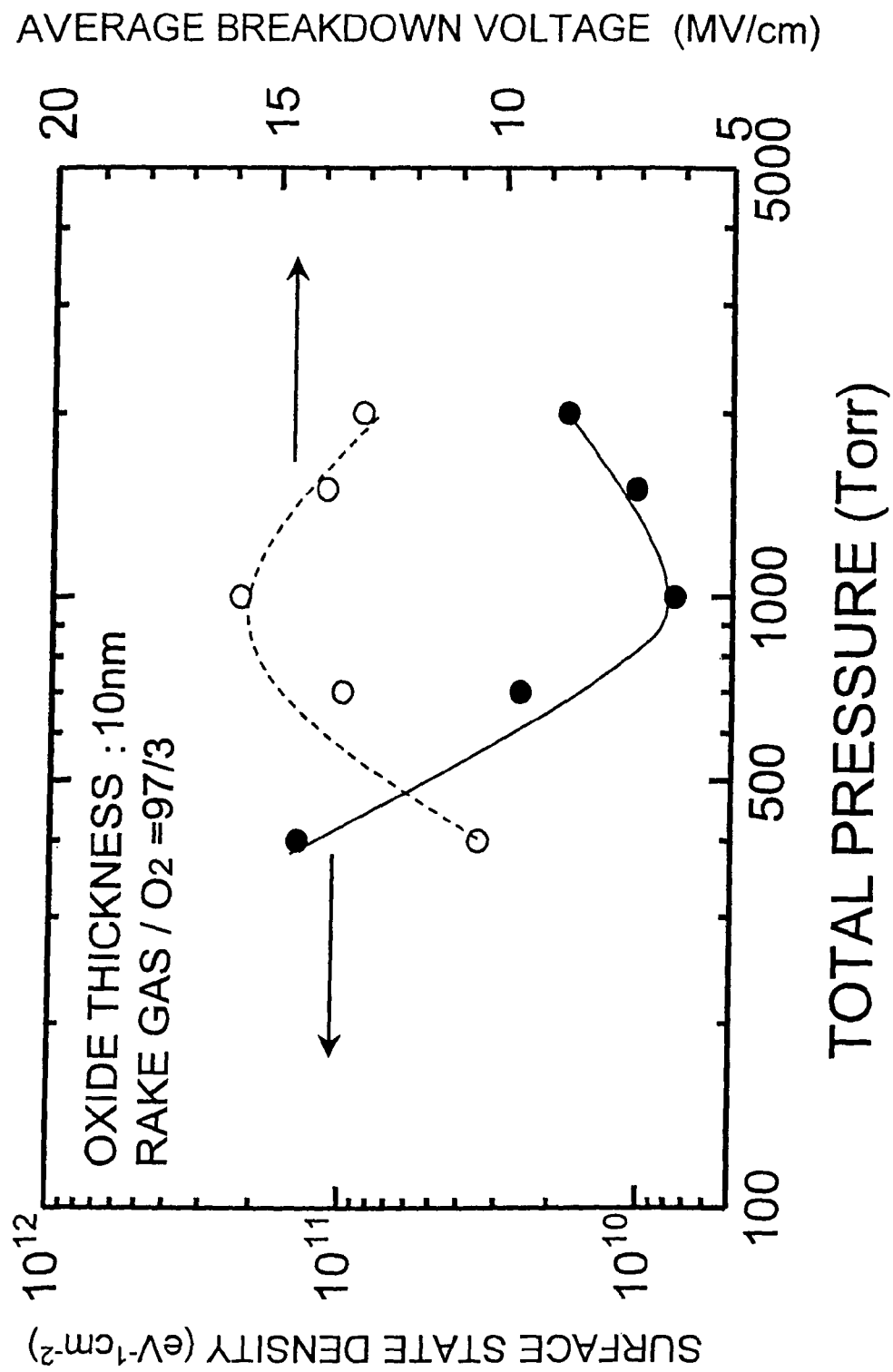
FIG. 7 is a diagram showing the relationship between the total pressure used in the plasma processing apparatus of FIG. 1 for forming an Si oxide film and the surface state density and breakdown voltage of the Si oxide film thus formed.

FIG. 7 shows a relationship between the process pressure used when forming a silicon oxide film by the low-temperature plasma oxidation processing in the $Kr/O_2$ mixed gas and the breakdown voltage of the silicon oxide film thus formed. Further, FIG. 7 shows the relationship between the process pressure and the surface state density of the silicon oxide film. In FIG. 7, it should be noted that the oxygen partial pressure is set to 3%. Further, it should be noted that a similar relationship is obtained also in the case the Si oxide film is formed on the (100) surface and on the (111) surface.

Referring to FIG. 7, it can be seen that the breakdown voltage of the silicon oxide film becomes maximum and the surface state density becomes minimum when the process pressure of about 1 Torr is used at the time of the oxide film formation. From the result of this, it is concluded that the preferable pressure of forming an oxide film by using a $Kr/O_2$ mixed gas would be in the rage of 800-1200 mTorr.

In addition to the foregoing, other various preferable features were obtained for the oxide film formed by the $Kr/O_2$ high-density plasma process with regard to electronic and reliability characteristics, including breakdown characteristics, leakage characteristics, hotcarrier resistance, and the QBD (Charge-to-Breakdown) characteristics, wherein the QBD represents the amount of electric charges that leads a silicon oxide film to breakdown as a result of application of a stress current. The characteristics thus obtained are comparable to those of the thermal oxide film that is formed at 900° C.

As noted above, the oxide film formed by the $Kr/O_2$ high-density plasma shows excellent characteristics equivalent to those of a conventional high-temperature thermal oxide film formed on the (100) surface, irrespective of whether the oxide film is formed by the oxidation of the (100) surface or the oxide film is formed by the oxidation of the (111) surface, in spite of the fact that the oxide film is formed by the oxidation process at low temperature of 400° C. One reason such a preferable result is obtained may be that the oxide film thus formed contains Kr therein.

In more detail, the Kr atoms thus incorporated into the oxide film is thought as causing relaxation of stress in the film or in the Si/SiO$_2$ interface. The relaxation of stress thus achieved, in turn, may result in a reduction of trapping electric charges or surface state density, while such a reduction of the defects leads to the observed improvement of the electric properties of the Si oxide film. Particularly, it is thought important that the Si oxide film contains therein Kr with a surface density of $5 \times 10^{11}$ cm$^{-2}$ for improving the electric properties and reliability properties of the Si oxide film as represented in FIG. 4.

By using the gate oxide film, a MIS transistor is formed and the surface-orientation dependence of the channel mobility is measured. As a result, it was confirmed, as will be explained later with reference to embodiment, that there occurs an increase of channel mobility by the factor of about 1.2 or more when the transistor is formed on the Si (111) surface as compared with the case of forming the transistor on the Si (100) surface, for both of the cases in which the MIS transistor is a p-channel transistor and the MIS transistor is an n-channel transistor.

It should be noted that the process of the oxide film formation of the present invention is by no means limited to the one that uses the substrate processing apparatus of FIG. 1, but any other plasma processing apparatuses may be used, as long as low-temperature oxide film formation is possible by a plasma process. For example, it is possible to use a two-stage showerplate type plasma processing apparatus that uses first gas releasing means that releases a Kr gas for causing microwave excitation of plasma and a second gas releasing means that releases an oxygen gas.

Next, a low-temperature nitride film formation conducted by using plasma will be explained.

The nitride film formation of the present invention is conducted also by the substrate processing apparatus of FIG. 1, wherein it should be noted Ar or Kr is used as the plasma excitation gas at the time of the nitride film formation.

Thus, the vacuum vessel (processing chamber) 101 is evacuated to a high vacuum state first, and the pressure inside the processing chamber 101 is then set to about 100 mTorr (about 13 Pa) by introducing an Ar gas and a NH$_3$ gas via the shower plate 102. Further, a disk-shaped substrate such as a silicon wafer is placed on the stage 104 as the substrate 103 and the substrate temperature is set to about 500° C. As long as the substrate temperature is in the range of 400-500° C., almost the same results are obtained.

Next, a microwave of 2.45 GHz is introduced into the processing chamber from the coaxial waveguide 105 via the radial line slot antenna 106 and further through the dielectric plate 107, and there is induced high-density plasma in the processing chamber. It should be noted that a similar result is obtained as long as a microwave in the frequency of 900 MHz or more but not exceeding 10 GHz is used. In the illustrated example, the distance between the shower plate 102 and the substrate 103 is set to 6 cm. Narrower the distance, faster the film formation rate.

While the present embodiment shows the example of forming a film by using the plasma apparatus that uses the radial line slot antenna, it is possible to use other method for introducing the microwave into the processing chamber. In the present embodiment, it should be noted that an Ar gas is used for exciting plasma. However, a similar result is obtained also when a Kr gas is used. While the present embodiment uses NH$_3$ for the plasma process gas, it is also possible to use a mixed gas of N2 and H2 for this purpose.

In the high-density plasma excited in the mixed gas of Ar or Kr and NH$_3$ (or alternatively N$_2$ and H$_2$), there are formed NH* radicals efficiently by Ar* or Kr* having an intermediate excitation state, and the NH* radicals thus formed cause the desired nitridation of the substrate surface.

Conventionally, there has been no report of direct nitridation of silicon surface. Thus, a nitride film has been formed by a plasma CVD process, and the like. However, the nitride film thus formed by a conventional plasma CVD process does not have the quality required for a gate insulation film of a transistor. In the nitridation process of silicon according to the present embodiment, on the other hand, it is possible to form a high-quality nitride film at low temperature on any of the (100) surface and the (111) surface, irrespective of the surface orientation of the silicon substrate.

Meanwhile, it should be noted that existence of hydrogen is an important factor when forming a silicon nitride film by the process of the present invention. With the existence of hydrogen in plasma, the dangling bonds existing in the silicon nitride film or at the nitride film interface are terminated in the form of Si—H bond or N—H bond, and the problem of electron trapping within the silicon nitride film or on the silicon nitride interface is eliminated.

The existence of the Si—H bond and the N—H bond in the nitride film is confirmed in the present invention by infrared absorption spectroscopy or X-ray photoelectron spectroscopy. As a result of the existence of hydrogen, the hysteresis of the CV characteristic is also eliminated, and the surface state density of the silicon/silicon nitride interface is suppressed to the level of below $3 \times 10^{10}$ cm$^{-2}$. When forming the silicon nitride film by using a rare gas (Ar or Kr) and a mixed gas of N$_2$/H$_2$, it becomes possible to reduce the trapping of electrons or holes in the film sharply by setting the H$_2$ partial pressure in the mixed gas to be 0.5% or more.

Figure 8:
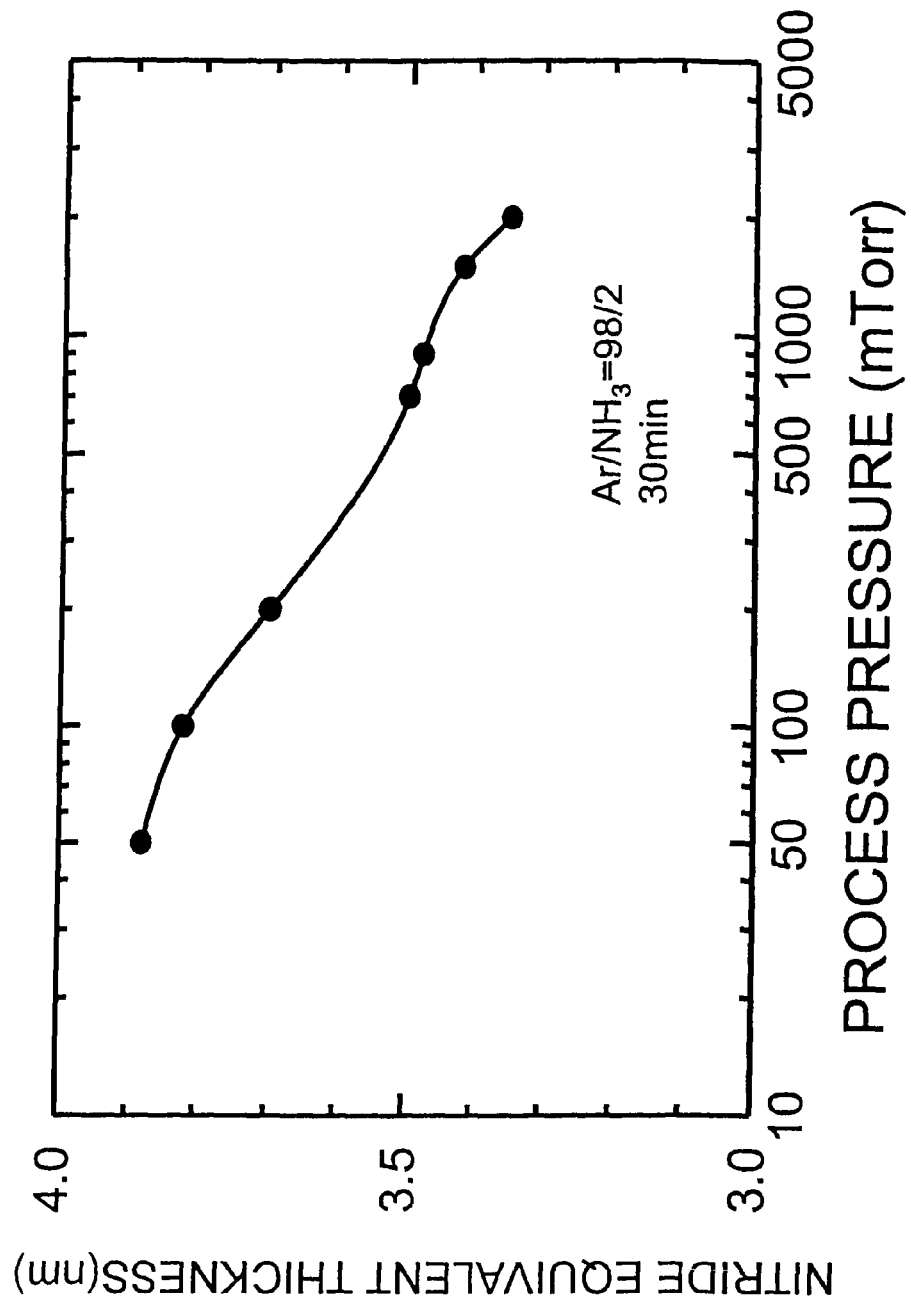
FIG. 8 is a diagram showing the relationship between the total pressure of the atmosphere used in the plasma processing apparatus of FIG. 1 for forming a nitride film and the thickness of the nitride film thus formed.

FIG. 8 shows the pressure dependence of the film thickness of the silicon nitride film thus formed according to the foregoing process. In the illustrated example, the ratio of the Ar gas to the NH$_3$ gas is set to 98:2 in terms of partial pressure, and the film formation was conducted over the duration of 30 minutes.

Referring to FIG. 8, it can be seen that the growth rate of the nitride film increases when the pressure in the processing chamber 101 is reduced so as to increase the energy given to NH$_3$ (or N$_2$/H$_2$) from the inert gas (Ar or Kr). From the viewpoint of efficiency of nitridation, it is therefore preferable to use the gas pressure of 50-100 mTorr (about 7-13 Pa). Further, it is preferable to set the partial pressure of NH$_3$ (or N$_2$/H$_2$) in the rare gas atmosphere to 1-10%, more preferably to 2-6%.

It should be noted that the silicon nitride film of the present embodiment has a dielectric constant of 7.9, which is almost twice as large as that of a silicon oxide film.

Figure 9:
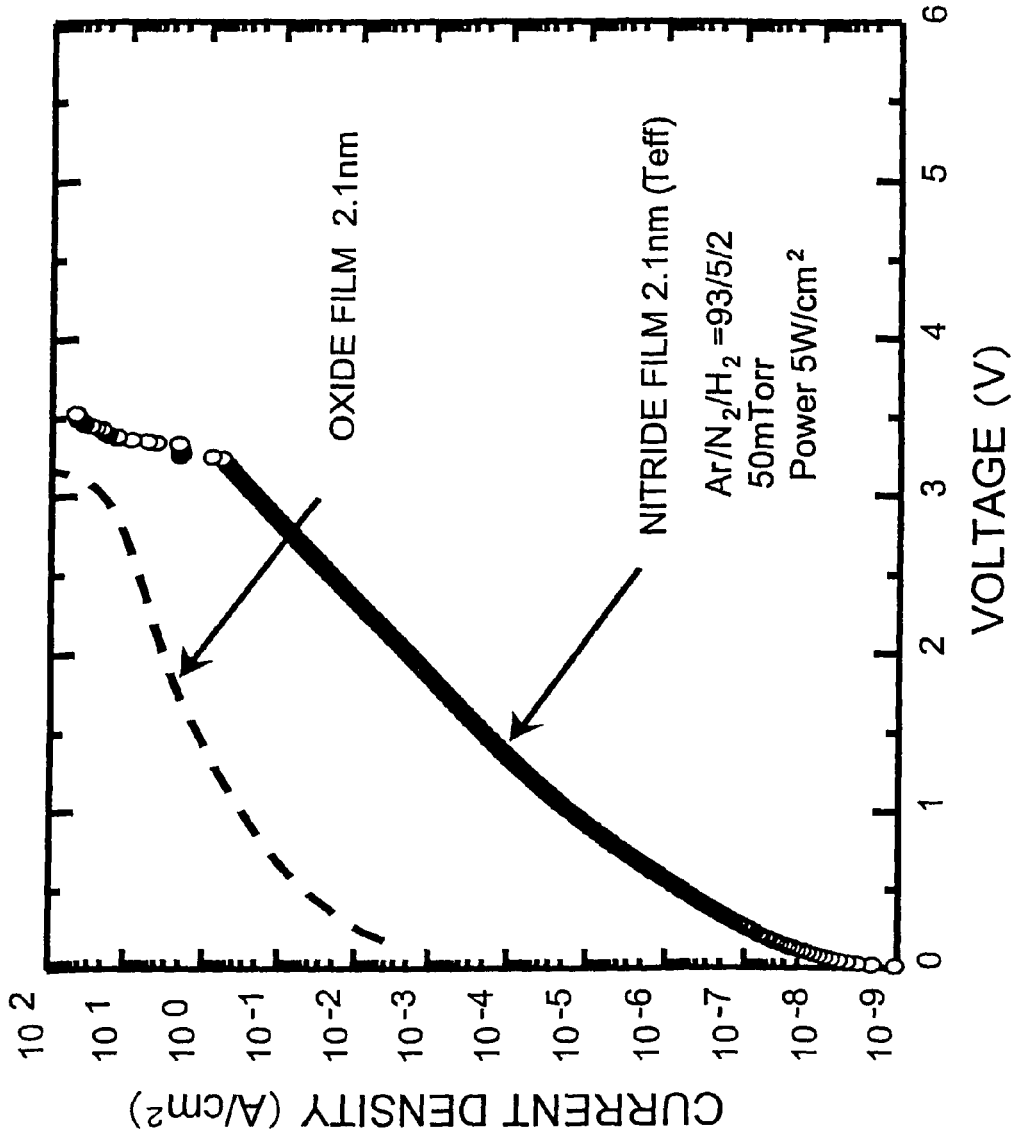
FIG. 9 is a diagram showing the current-voltage characteristic of a silicon nitride film formed by the substrate processing apparatus of FIG. 1.

FIG. 9 shows the current-voltage characteristic of the silicon nitride film of the present embodiment. It should be noted that the result of FIG. 9 is obtained for the case in which a silicon nitride film having a thickness of 4.2 nm (2.1 nm in terms of oxide film equivalent thickness) is formed by using a gas mixture of Ar/N$_2$/H$_2$ while setting the gas composition ratio, Ar:N$_2$:H$_2$, to 93:5:2 in terms of partial pressure. In FIG. 9, the result for the foregoing nitride film is compared also with the case of a thermal oxide film having a thickness of 2.1 nm.

Referring to FIG. 9, it can be seen that there is realized a very small leakage current, smaller than the leakage current of a silicon oxide film by a factor of $10^4$ or more, for the Si nitride film, provided that a voltage of 1 V is applied thereto for the measurement. This result of FIG. 9 indicates that there is a possibility of breaking through the limitation hitherto imposed on miniaturization of transistors due to the leakage current in the gate oxide film, by using the Si nitride film of the present invention.

It should be noted that the foregoing condition of film formation, the property of the film, or the electric characteristic of the film are obtained similarly on any of the surfaces of the silicon crystal. In other words, the same result is obtained on the (100) surface and also on the (111) surface.

It should be noted that the existence of the Si—H bond or N—H bond in the film is not the only cause of the foregoing advantageous feature of the present invention of realizing a nitride film having a leakage current characteristic superior to that of a thermal oxide film on a Si (100) surface. The existence of Ar or Kr in the film contributes also to the foregoing advantageous result. As a result of the existence of Ar or Kr in the film, it should be noted that the stress within the nitride film or the stress at the silicon/nitride film interface is relaxed substantially, while this relaxation of stress also contributes to the reduction of fixed electric charges and the surface state density in the silicon nitride film, which leads to the remarkable improvement of electric properties and reliability. Particularly, the existence of Ar or Kr with the surface density of $5 \times 10^{11}$ cm$^{-2}$ or less at the film surface is thought as contributing effectively to the improvement of electric characteristics and reliability of the silicon nitride film, just in the case of the silicon oxide film represented in FIG. 4.

By using the nitride film of the present invention for the gate insulation film, a MIS transistor is formed and the surface-orientation dependence of the channel mobility is measured. As a result, it was confirmed, as will be explained later with reference to embodiment, that there occurs an increase of channel mobility by the factor of about 1.3 or more when the transistor is formed on the Si (111) surface as compared with the case of forming the transistor on the Si (100) surface, for both of the cases in which the MIS transistor is a p-channel transistor and the MIS transistor is an n-channel transistor.

It should be noted that the process of the nitride film formation of the present invention is by no means limited to the one that uses the substrate processing apparatus of FIG. 1, but any other plasma processing apparatuses may be used, as long as low-temperature oxide film formation is possible by a plasma process. For example, it is possible to use a two-stage shower-plate type plasma processing apparatus that uses first gas releasing means that releases an Ar or Kr gas for causing microwave excitation of plasma and second gas releasing means that releases an NH$_3$ gas (or a mixed gas of N$_2$ and H$_2$).

First Embodiment

Next, a description will be made on a semiconductor device according to a first embodiment of the present invention that uses a two-layer structure of low-temperature oxide film and nitride film formed in a plasma for the gate insulation film.

In the present embodiment, the substrate processing apparatus of FIG. 1 is used for the formation of the oxide film and nitride film. Thereby, Kr is used for the plasma gas.

Referring to FIG. 1, the vacuum vessel (processing chamber) 101 is evacuated to a vacuum state and a Kr gas and an O$_2$ gas are introduced into the processing chamber 102 from the shower plate 102 such that the pressure inside the processing chamber 101 is set to about 1 Torr. Further, the temperature of the silicon wafer is set to about 450° C.

Next, a microwave having the frequency of 2.45 GHz is introduced into the processing chamber from the coaxial waveguide 105 through the radial line slot antenna 106 and the dielectric plate 107, and high-density plasma is formed in the processing chamber 101. As a result, a Si oxide film is formed on the Si substrate constituting the wafer with a thickness of about 1 nm.

Next, the supply of the microwave is interrupted temporally, and the supply of the Kr gas and the O$_2$ gas is interrupted. Further, the processing chamber 101 is evacuated to high vacuum state. Next, a Kr gas and an NH$_3$ gas is introduced from the shower plate 102, and the pressure inside the processing chamber 101 is set to about 100 mTorr. Further, the microwave of the 2.45 GHz frequency is introduced again into the processing chamber 101 to form high-density plasma therein. As a result, a Si nitride film is formed on the Si oxide film with a thickness of about 2 nm.

The stacked film of the Si oxide film and the Si nitride film thus formed is characterized by a very small surface state density as explained with reference to FIG. 5, and the stacked film as a whole has an effective specific dielectric constant of about 6.7. Further, it was confirmed that the stacked film thus formed shows excellent electric and reliability performance in terms of leakage current characteristics, breakdown characteristics, hotcarrier resistance, and the like. The stacked film shows no dependence of surface orientation, and the film formed on the (100) surface and the film formed on the (111) surface both have excellent performance.

FIGS. 10A-10D show the fabrication process of a MIS transistor according to a first embodiment of the present invention.

Figure 10A:
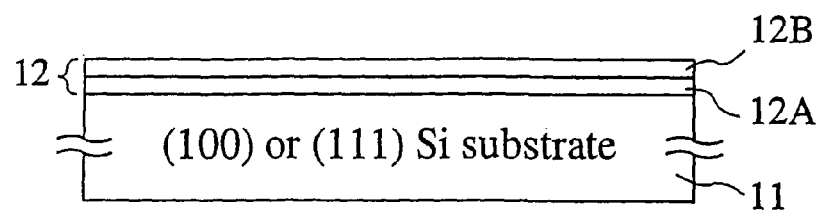
FIGS. 10A-10D are diagrams showing the construction of a MOS transistor according to a first embodiment of the present invention.
Figure 10B:
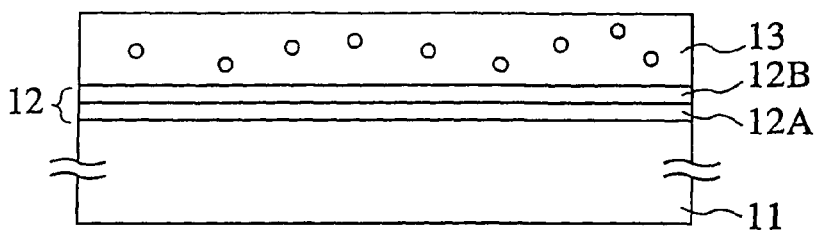
Figure 10C:
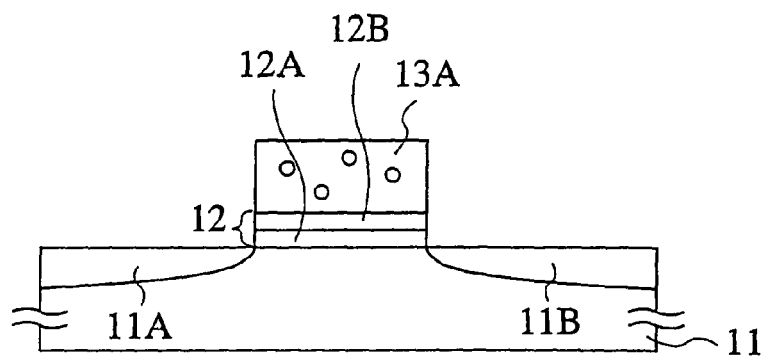

Referring to FIG. 10A, a stacked gate insulation film 12 is formed on a (100) principal surface or a (111) principal surface of a Si substrate 11, by depositing a Si oxide film 12A and a Si nitride film 12B with respective thicknesses of 1 nm and 2 nm by conducting the process steps explained before in the substrate processing apparatus of FIG. 1. Next, in the step of FIG. 10B, a polysilicon film 13 is deposited on the stacked gate insulation film 12.

Next, in the step of FIG. C, the polysilicon film 13 is patterned into a gate electrode 13A, and ion implantation process of impurity element is conducted into the Si substrate 11 while using the gate electrode 13A as a mask. As a result, LDD regions 11A and 11B are formed in the substrate 11 at both lateral sides of the gate electrode 13A.

Figure 10D:
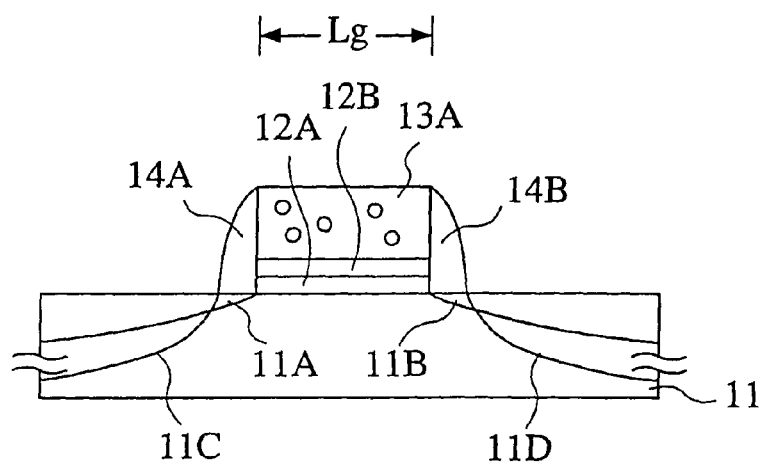

Next, in the step of FIG. 10D, sidewall insulation films 14A and 14B are formed on respective sidewall surfaces of the gate electrode 13A, and high-concentration diffusion regions 11C and 11D are formed in the substrate 11 at outer regions of the sidewall insulation films 14A and 14B as source and drain regions of the MIS transistor. The diffusion regions 11C and 11D are formed by conducting an ion implantation process of an impurity element while using the sidewall insulation films 14A and 14B as a mask.

According to the MIS transistor of the present invention, the gate insulation film 12 has the nature of low surface state density characteristic to an oxide film and the nature of high dielectric constant characteristic to a nitride film, and it becomes possible to suppress the increase of the gate leakage current even in the case the gate length Lg is reduced below 0.1 μm.

Measurement of the channel mobility conducted on the MIS transistor of FIG. 10D with regard to the surface orientation dependence of the channel mobility has revealed the fact that the channel mobility increases by the factor of about 1.2 or more in the transistor formed on the (111)-oriented Si substrate as compared with the transistor formed on the (100)-oriented Si substrate, irrespective of whether the MIS transistor is an n-channel transistor or the MIS transistor is a p-channel transistor.

In the present embodiment, the stacked gate insulation film 12 includes the oxide film 12A at the side of the Si substrate 11. However, it is also possible to reverse the order of the oxide film 12A and the nitride film 12B according to the needs. Further, it is possible to use a stacked gate insulation film in which further layers are stacked, such as the one having an oxide/nitride/oxide structure or a nitride/oxide/nitride structure in place of the stacked gate insulation film 12.

Second Embodiment

Figure 11A:
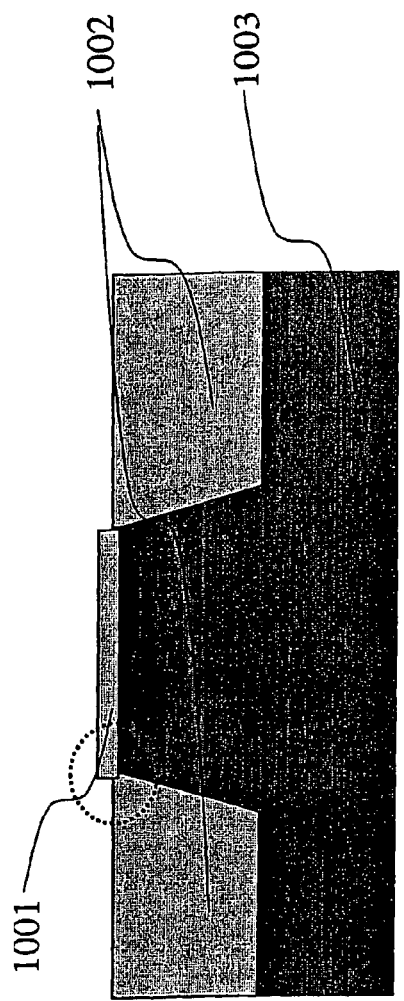
FIGS. 11A-11C are cross-sectional diagrams showing a part of a semiconductor integrated circuit device having an STI structure according to a second embodiment of the present invention.

FIG. 11A shows a typical conventional STI structure.

Referring to FIG. 11A, the STI structure is formed by the steps of forming a device isolation groove by applying a plasma etching process to the surface of a Si substrate 1003, depositing a Si oxide film 1002 on the surface of the Si substrate 1003 thus formed with the device isolation groove by a CVD process, and planarizing the Si oxide film 1002 thus deposited by a CMP process, and the like, to remove the Si oxide film from the surface of the Si substrate 1003.

After the foregoing polishing step by the CMP process, the exposed Si substrate surface is subjected to a sacrificing oxidation process at 800-900° C., and the Si oxide film formed as a result of the sacrificing oxidation process is etched by an agent containing HF. Thereby, a highly clean Si substrate is obtained.

The clean substrate surface thus obtained is further cleaned by using an RCA cleaning process, and the like, and a gate insulation film 1001 is formed on the Si substrate surface with a thickness of about 4 nm.

Figure 11B:
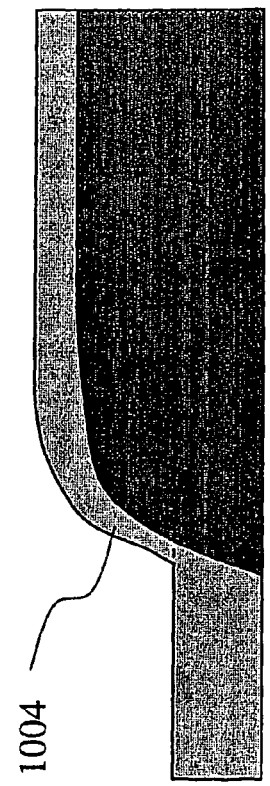

In such a conventional STI structure, there has been a problem, when a gate insulation film is formed on the Si substrate having the (100) surface orientation by a thermal oxidation process, in that the thickness of the Si oxide film is reduced at a corner part 1004 of the device isolation groove as represented in FIG. 11B, irrespective of whether the Si oxide film is formed by a dry oxidation process or a wet oxidation process, or irrespective of the temperature of the film formation. It should be noted that an (111) surface of Si is exposed at such a corner part. Thus, such a conventional STI structure has caused the problem of increase of leakage current in such a corner part 1004, and the semiconductor device or semiconductor integrated circuit device has suffered from the problem of unstable operational characteristic.

Figure 11C:
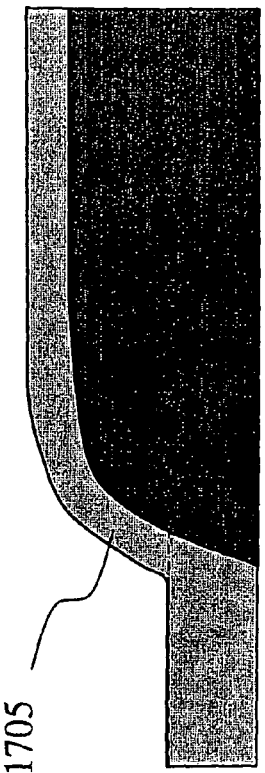

In the case, a Si oxide film is formed according to the Kr/O$_2$ plasma oxidation process explained before, it was confirmed that there occurs no thinning of the Si oxide film such as the one represented in FIG. 11B. See the corner part 1705 of the device isolation groove represented in FIG. 11C. It is believed that the result of FIG. 11C is the outcome of the atomic state oxygen O* reaching the region in the vicinity of the corner part 1005 efficiently in the Kr/O$_2$ plasma oxidation processing of the present invention.

The overall QBD (Charge-to-Breakdown) characteristic of the STI structure thus formed by the Kr/O$_2$ plasma oxidation processing is excellent and it was confirmed that no breakdown occurs until the injected electric charges reach a value of 102 C/cm$^2$. Thereby, the reliability of the semiconductor integrated circuit device is improved substantially.

In the case the Si oxide film in the STI structure is formed by conventional thermal oxidation process, the degree of thinning of the Si oxide film at the foregoing corner part increases with increasing taper angle of the device isolation groove. However, no such a thinning of the oxide film occurs when the oxide film is formed by the Kr/O$_2$ plasma oxidation processing of the present invention, even when the taper angle of the device isolation groove is increased. Thus, the present invention enables use of a device isolation groove having a steep taper angle in an STI structure. As a result, it becomes possible to reduce the area occupied by an STI structure on a substrate. Thus, the present invention enables further improvement of integration density of semiconductor integrated circuits. Conventionally, the taper angle of the device isolation groove has been set to about 70 degrees because of the reasons noted before. On the contrary, excellent characteristics are obtained even when the taper angle of 90 degrees is used. Thus, it becomes possible to achieve an integration density twice as large as that of a conventional semiconductor integrated circuit.

In the case a Si nitride film is formed on the (100) principal surface of the Si substrate by the Ar/NH$_3$ plasma nitriding processing, it is also possible to form a Si nitride film on the corner part 1001 of the device isolation groove where the (111)-oriented surface is exposed, with high film quality and without localized thinning of the film thickness. As a result, the semiconductor integrated circuit having such an STI structure shows excellent electric characteristics and high reliability. Similarly to the case of oxidation process, the behavior of radicals is important in the plasma nitriding process. It is believed that the NH* radicals thus formed are transported efficiently to the corner part 1001 of FIG. 11A, particularly to the region in the vicinity of the corner part 1005 of FIG. 11C.

In the construction of FIG. 11A, a MIS transistor is formed by providing a Si nitride film having a thickness of 4 nm (Si oxide equivalent thickness of 2 nm) as the gate insulation film 1001. It was observed that the MIS transistor thus formed has excellent electric properties, particularly with regard to the driving power, which has a value twice as large as that of a MIS transistor having a Si oxide film of 4 nm thickness as the gate insulation film.

Third Embodiment

Figure 12:
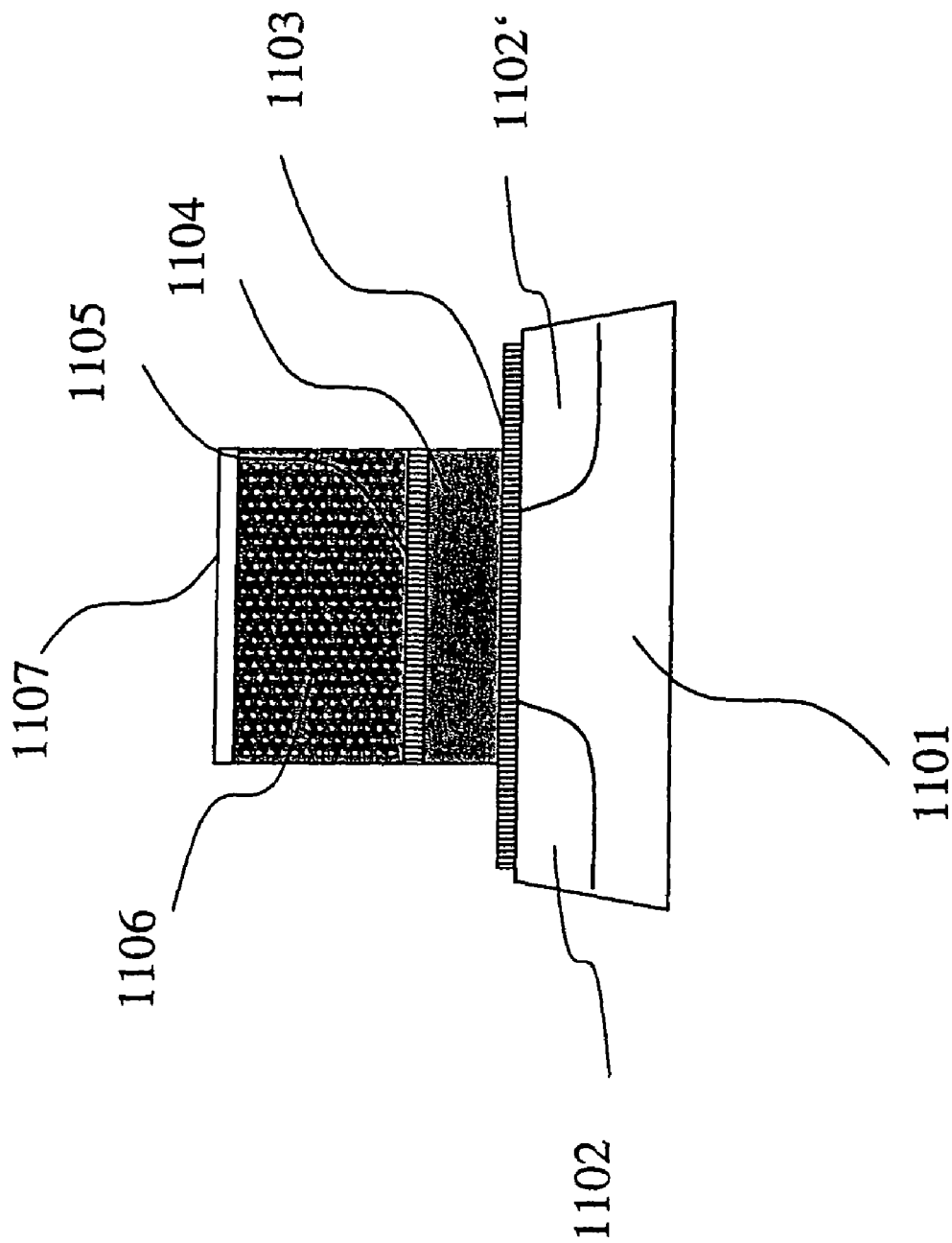
FIG. 12 is a cross-sectional diagram showing the schematic construction of a ferroelectric memory device according to a third embodiment of the present invention.

FIG. 12 is a cross-sectional diagram showing the schematic construction of a ferroelectric memory device according to a third embodiment of the present invention.

Referring to FIG. 12, the ferroelectric memory device is constructed on a Si substrate in which a p-type well 1101 is formed, wherein the p-type well 1101 is formed with a source region 1102 and a drain region 1102' of n-type. Further, a Si nitride film 1103 is formed on the Si substrate with a thickness of 5 nm as the gate insulation film, wherein the nitride film 1103 is formed by the foregoing Ar/NH$_3$ plasma processing conducted at the temperature of 400° C. Further, a polysilicon gate electrode 1104 of n-type is formed on the gate insulation film 1103.

Further, a Si nitride film 1105 is formed on the polysilicon gate electrode 1104 with a thickness of 5 nm by conducting the foregoing Ar/NH$_3$ plasma nitriding processing at the temperature of 400° C., and a ferroelectric film 1106 of SrTaNbO system is formed on the Si nitride film 1105 with a thickness of about 150 nm. Further, a Pt electrode 1107 is formed on the ferroelectric film 1106.

Typically, the ferroelectric film 1106 is formed by a sputtering process such that there appears a Sr:Ta:Nb of 1:0.7:0.3 in the ferroelectric film, and a plasma oxidation process is conducted thereafter at the temperature of 400° C. by carrying out the Kr/O$_2$ plasma oxidation processing explained before. As a result, the ferroelectric film 1106 has a composition represented as Sr$_2$(Ta$_{0.7}$Nb$_{0.3}$)$_2$O$_7$.

It should be noted that the source region 1102 and the drain region 1102' are formed by conducting an ion implantation without causing the ions to pass through the gate oxide film, and an electric activation process is conducted thereafter at 400° C. The ferroelectric memory device of FIG. 12 uses a gate length of 0.35 μm.

The ferroelectric film of the SrTaNbO system has a specific dielectric constant of about 40 and has been known as being effective for reducing the writing voltage of a ferroelectric memory device that uses a thermal oxide film for the gate insulation film. The present invention uses, on the contrary, a silicon nitride film formed by the Ar/NH$_3$ plasma nitriding process of the present invention for the gate insulation film 1103, wherein the use of such a silicon nitride film for the gate insulation film has become possible for the first time by the present invention. As a result of use of the silicon nitride film for the gate insulation film, the dielectric constant of the gate insulation film has increased twice as compared with the case in which a Si oxide film is used for the gate insulation film. As a result, it becomes possible to reduce the writing voltage by a factor of about 1/1.9 in the ferroelectric memory device of the present invention as compared with a conventional ferroelectric memory device.

In conventional ferroelectric memory devices, it has been practiced to provide a diffusion barrier layer of IrO$_2$, and the like, between the polysilicon gate electrode 1104 and the ferroelectric film 1106 of the SrTaNbO system. However, such a construction has a drawback in that the Ir atoms in the IrO$_2$ film may penetrate into the underlying polysilicon gate electrode 1104 and provide adversary effect to the electric properties of the ferroelectric memory device. In the present invention, on the other hand, it has became possible to form the Si nitride film 1105 on the polysilicon gate electrode 1104, which has the <111> preferred orientation, at low temperature. The Si nitride film thus formed is dense and provides no adversary effect at all to the underlying semiconductor device. Further, the Si nitride film thus formed functions as an effective diffusion barrier film.

In conventional ferroelectric memory devices, the ferroelectric film 1106 of the SrTaNbO system has been formed by a sol-gel process, followed by a crystallization process conducted by a thermal annealing process at high temperature of 900° C. or more. However, the ferroelectric film formed by such a conventional process has suffered from the problem of inhomogeneous film composition and deterioration of device performance that is caused by elemental diffusion associated with the use of high temperature. Further, the ferroelectric film thus formed shows a poor leakage characteristic. On the contrary, the present invention enables formation of a high-quality Sr$_2$(Ta$_{0.7}$Nb$_{0.3}$)$_2$O$_7$ film characterized by the features of excellent uniformity, free from element diffusion, excellent leakage current characteristic, and the like, by accurately controlling the Sr:Ta:Nb ratio to 1:0.7:0.3 in the sputtering process of the SrTaNbO film and further by applying the Kr/O$_2$ plasma oxidation process at low temperature.

In a ferroelectric memory integrated circuit that includes a two-dimensional array of the ferroelectric memory devices, the writing voltage is reduced by one-half as compared with a conventional ferroelectric memory integrated circuit device and the driving power is improved by twice. Further, the retention time for retaining written information is increased by about 100 times as compared with a conventional ferroelectric memory device. Further, the number of possible rewriting cycles is increased.

It should be noted that the entire process steps for forming the ferroelectric memory device of the present embodiment can be conducted at a temperature of 400° C. or less. As a result, it is possible to form the ferroelectric memory device on an SOI substrate that includes a metal layer in a Si substrate, or on a polysilicon layer formed on an insulation layer that covers a metal interconnection pattern formed on a substrate.

Fourth Embodiment

Figure 13:
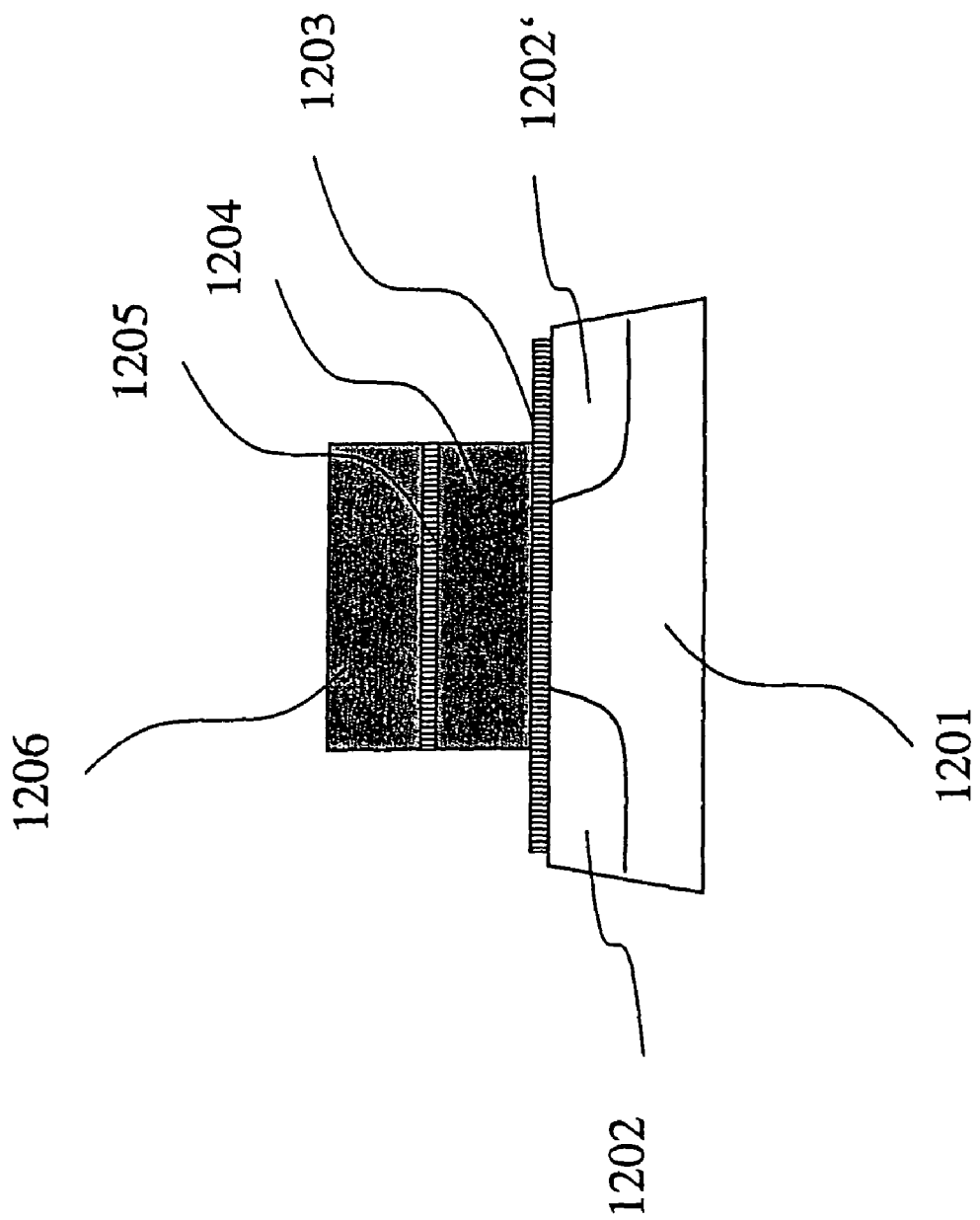
FIG. 13 is a cross-sectional diagram showing the schematic construction of a flash memory device according to a fourth embodiment of the present invention.

FIG. 13 is a cross-sectional diagram showing the schematic construction of a flash memory device according to a fourth embodiment of the present invention.

Referring to FIG. 13, the flash memory device is formed on a Si substrate in which a p-type well 1201 is formed, wherein diffusion regions 1202 and 1202' of n-type are formed in the p-type well 1201 as source and drain regions respectively.

On the Si substrate, a Si nitride film 1203 is formed by the Ar/NH$_3$ plasma nitriding process explained before at the temperature of 400° C. with a thickness of about 6 nm, and a polysilicon floating gate electrode 1204 is formed on the Si nitride film 1203. Further, a Si nitride film 1205 is formed on the polysilicon floating gate electrode 1204 by the Ar/NH$_3$ plasma nitriding processing explained before at the temperature of 400° C. with the thickness of 4 nm. Further, a control gate electrode 1206 of polysilicon is formed on the Si nitride film 1205.

During the fabrication process of the flash memory device of FIG. 13, the source region 1202 and the drain region 1202' are formed by an ion implantation of an n-type impurity element such that the ions are introduced without passing through the gate oxide film. The ions thus introduced are then activated electrically by a thermal processing at 400° C. In the illustrated example, the flash memory device is formed to have a gate length of 0.25 μm.

In the present embodiment, it becomes possible to form a low-temperature nitride film as the gate insulation film 1203 and the insulation film 1205 that covers the polysilicon gate electrode 1204 in which the <111> preferred orientation is formed. The Si nitride films 1203 and 1205 are dense and characterized by very low leakage current. As a result, the flash memory device provides a memory retention time larger by a factor of ten or more with regard to a conventional flash memory device.

It should be noted that the Si nitride film 1203 has excellent hot-carrier resistance and it becomes possible to increase the number of rewriting cycles by a factor of ten or more as compared with a conventional flash memory device. Further, the Si nitride film 1205 interposed between the floating gate electrode 1204 and the control gate electrode 1205 maintains the excellent electrical properties even when the thickness thereof is reduced. Thus, it becomes possible to reduce the writing voltage significantly in the flash memory device of the present embodiment.

It should be noted that a flash memory integrated circuit in which the flash memory devices of the present embodiment are arranged to form a two-dimensional array, the writing voltage is reduced by a factor of about 1/1.3 as compared with a conventional flash memory integrated circuit and the writing speed is improved by twice. Further, the retention time of written information is improved by a factor of 100 or more, and the number of rewiring cycles is increased significantly.

It should be noted that entire processes of the flash memory device of the present embodiment can be conducted at a temperature of about 400° C. or less. Thus, it becomes possible in the present embodiment to form a flash memory device on an SOI substrate, in which a metal layer is included in a Si substrate. Further, it becomes possible in the present embodiment to form a flash memory device on a polysilicon layer that is formed on an insulation film covering a metal interconnection pattern on a substrate.

In the present embodiment, too, it becomes possible to form the insulation films 1203 and 1205 by the Si oxide film that is formed by the Kr/O$_2$ plasma oxidation process explained before.

Fifth Embodiment

The foregoing gate oxidation process achieved by the Kr/O$_2$ microwave-excited high-density plasma in the substrate processing apparatus of FIG. 1, or the gate nitriding process achieved by the Ar (or Kr)/NH$_3$ (or N$_2$/H$_2$) microwave-excited plasma in the substrate processing apparatus of FIG. 1, is suitable for forming an integrated circuit device on a metal-substrate SOI wafer. Particularly, the present invention is most suitable for forming a semiconductor layer on a metal-substrate SOI wafer such that the (111) surface of Si crystal forms a principal surface and for forming an integrated circuit on the (111) surface. As explained before, a high surface density is realized for the Si atoms in the (111) surface of a Si crystal, and thus, a transistor formed on such a (111) surface has an advantageous feature of large driving power.

Figure 14:
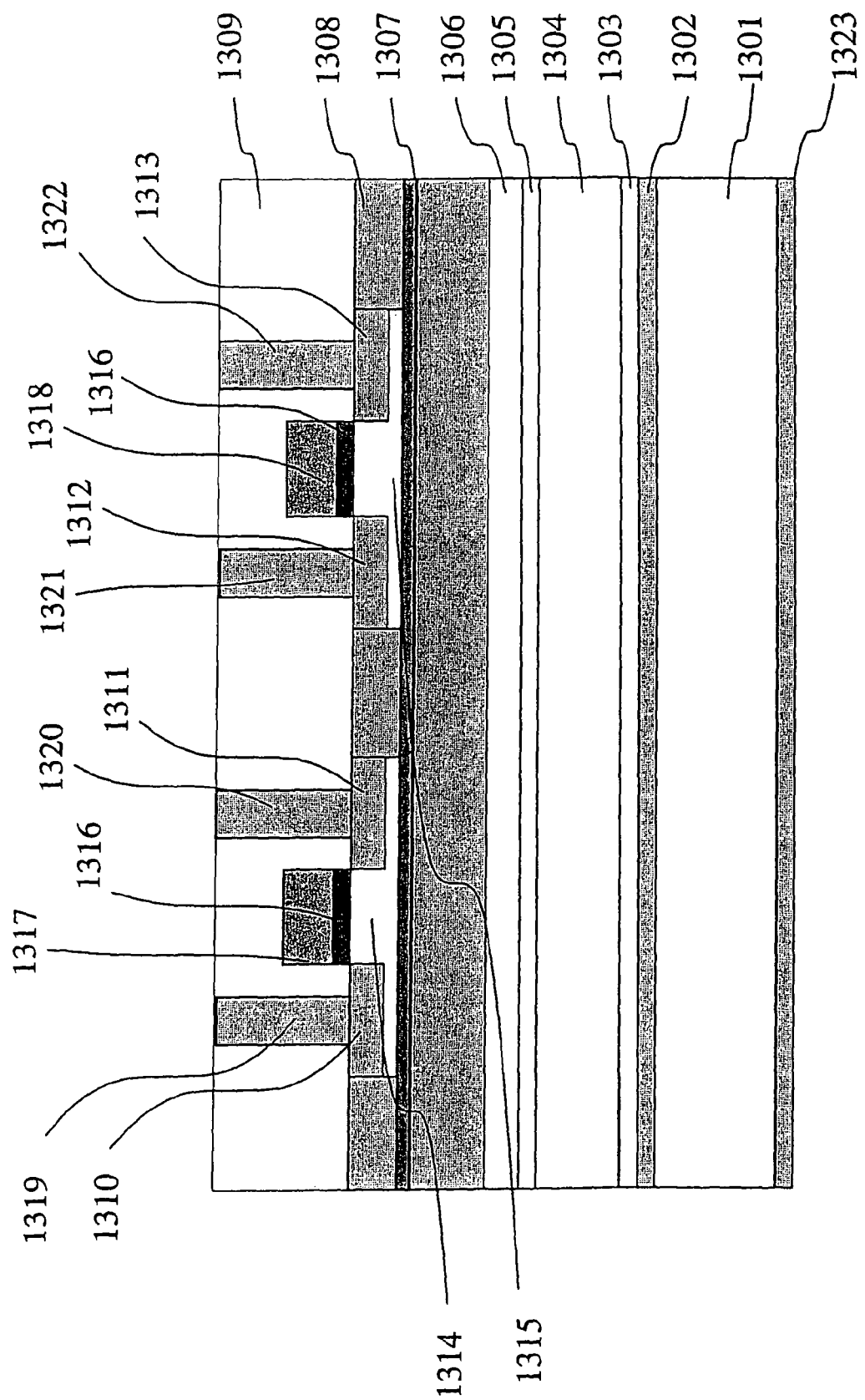
FIG. 14 is a cross-sectional diagram showing the schematic diagram of a MOS transistor formed on an SOI structure formed in turn on a metal substrate according to a fifth embodiment of the present invention.

FIG. 14 is a cross-sectional diagram showing the construction of a MOS transistor formed on a metal-substrate SOI structure.

Referring to FIG. 14, the metal-substrate SOI structure is formed of a low-resistance semiconductor layer 1301 of n+-type or p+-type, a silicide layer 1302 of NiSi, and the like, formed on the semiconductor layer 1301, a conductive nitride layer 1303 of TaN or TiN formed on the silicide layer 1302, a metal layer 1304 of Cu, and the like, formed on the conductive nitride layer 1303, a conductive nitride layer 1305 of TaN or TiN formed on the metal layer 1304, a low-resistance semiconductor layer 1306 of n+-type or p+-type formed on the conductive nitride layer 1305, and a nitride insulation film 1307 of AlN or Si$_3$N$_4$ formed on the low-resistance semiconductor layer 13306, and Si-layer regions 1314 and 1315 are formed on the nitride insulation film 1307 with a separation from each other as the active region of the MOS transistor. The Si layer regions 1314 and 1315 have a (111) principal surface.

In the Si-layer region 1314, a drain region 1310 of n+-type and a source region 1311 of n+-type are formed with a mutual separation, with a channel region formed therebetween. Similarly, a drain region 1312 of p+-type and a source region 1313 of p+-type are formed in the Si-layer region 1315 with a channel region interposed therebetween.

Each channel region of the Si-layer regions 1314 and 1315 is covered by a gate insulation film 1316 of SiO2, wherein the gate insulation film 1316 is formed by a Kr/O$_2$ plasma oxidation process.

In the Si-layer region 1314, an n-MOS gate electrode 1317 of Ta, Ti, TaN/Ta, TiN/Ta, and the like, is formed on the SiO$_2$ gate insulation film 1316. Further, a p-MOS gate electrode 1318 of Ta, Ti, TaN/Ta, or TiN/Ta is formed on the SiO2 gate insulation film 1316 in the Si-layer region 1315.

Further, an SiO$_2$ film 1308 is formed on the nitride insulation film 1307 so as to fill the region between the Si-layer regions 1314 and 1315, and an insulation film 1309 is formed on the SiO$_2$ film 1308, wherein the insulation film 1309 may be an SiO$_2$ film or a BPSG film or a combination of an SiO$_2$ film and a BPSG film. In the insulation film 1309, an electrode 1319 is formed in contact with the n+-type drain region 1310 and an electrode 1320 is formed in contact with the n+-type source region 1311 respectively as the drain electrode and the source electrode of the n-MOS transistor. Further, an electrode 1321 is formed in contact with the p+-type drain region 1312 and an electrode 1322 is formed in contact with the p+-type source region 1313 respectively as the drain electrode and the source electrode of the n-MOS transistor. Further, a bottom electrode 1323 is formed on the rear side of the Si layer 1301.

By using such a metal-substrate SOI structure, it becomes possible to obtain a MOS transistor operable at high speed and consumes little electric power.

Meanwhile, it is necessary, in such a substrate including a Cu layer protected by a TaN film or TiN film, to suppress the temperature of thermal processing applied to the substrate to 700° C. or less in order to suppress the problem of diffusion of Cu. Thus, the present embodiment forms the source region or drain region 1310-1313 by applying a thermal annealing process at about 550° C. after the ion implantation process of As+, AsF$_2$+ or BF$_2$+. Conventionally, the technology of forming a high-quality oxide film at a temperature of 700° C. or less has not been known. By using the technology of the Kr/O$_2$ microwave-excited high-density plasma oxidation of the present invention, it has become possible for the first time to form a semiconductor integrated circuit on a metal-substrate SOI structure represented in FIG. 14.

When the sub-threshold characteristic is compared between the MOS transistor of FIG. 14 and a conventional MOS transistor that uses a thermal oxide film for the gate insulation film, it is inevitable, in the case a thermal oxide film is used for the gate insulation film, that a kink or leakage appears in the sub-threshold characteristics. When the gate insulation film is formed by the foregoing Kr/O$_2$ plasma oxidation process, on the other hand, an excellent sub-threshold characteristic is obtained.

In the semiconductor integrated circuit device of FIG. 14, it is noted that the semiconductor layer regions 1314 and 1315 are separated form each other by forming a mesa-type device-isolation structure, while it is noted that there appears, in such a mesa device isolation structure, a Si crystal surface different from the crystal surface constituting the principal surface at the sidewall surface of the semiconductor layer region 1314 or 1315 that forms a mesa region. By conducting the Kr/O$_2$ plasma oxidation processing explained before, it becomes also possible to cover the sidewall surface of the mesa region by an oxide film of uniform thickness similarly to the principal surface. Thus, the MOS transistor of FIG. 14 shows excellent electric properties and provides excellent reliability.

In the present embodiment, it is also possible to use a Si nitride film formed by the Ar/NH$_3$ nitriding processing for the gate insulation film 1316 in place of the Si oxide film formed by the Kr/O$_2$ plasma oxidizing processing. In this case, too, it is possible to obtain a highly reliable semiconductor integrated circuit formed on the metal-substrate SOI structure. For example, excellent electric properties are guaranteed in the case a Si nitride film having a thickness of 4 nm (2 nm in terms of Si oxide equivalent thickness) is used for the gate insulation film 1316. Further, the driving power of the transistor increases by about twice as compared with the case of using a Si oxide film of 4 nm thickness for the gate insulation film 1316.

Sixth Embodiment

Figure 15:
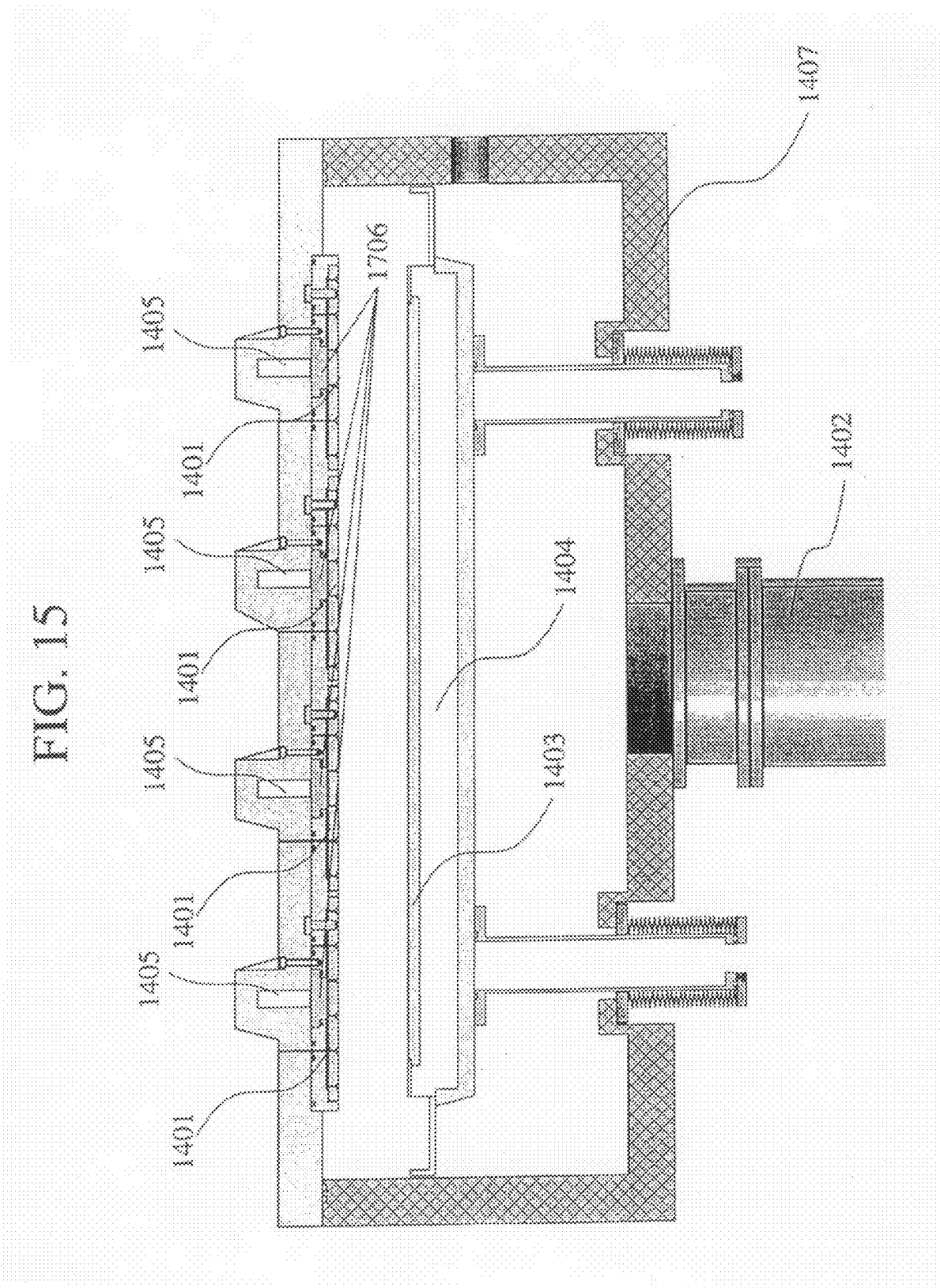
FIG. 15 is a cross-sectional diagram showing the schematic construction of a plasma processing apparatus applicable to a glass substrate or plastic substrate.

FIG. 15 is a schematic diagram showing an example of a substrate processing apparatus of the present invention designed for conducting oxidation or nitriding processing to a rectangular substrate such as a glass substrate or plastic substrate.

Referring to FIG. 15, the substrate processing apparatus includes a vacuum vessel (processing chamber) 1407 and a Kr/O$_2$ mixed gas is introduced in to the processing chamber 1407 from a shower plate 1401 in the state that the processing chamber 1407 is evacuated. The processing chamber 1407 may be evacuated by a screw groove pump 1402, and the pressure inside the processing chamber 1407 is set to about 1 Torr.

In the vacuum vessel 1407, there is provided a stage 1404 for holding a glass substrate 1403, wherein the stage 1404 is provided with a heating mechanism. Thus, the glass substrate 1403 is held on the stage 1404 at a temperature of about 30° C.

In the substrate processing apparatus of FIG. 15, a microwave is introduced into the processing chamber 1407 from a slit of a rectangular waveguide 1405 via a dielectric plate 1404, and there is formed high-density plasma in the processing chamber 1407 as a result. It should be noted thereby that the shower plate 1401 functions also as a waveguide for transmitting the microwave emitted by the waveguide 1405 laterally in the form of surface wave.

Figure 16:
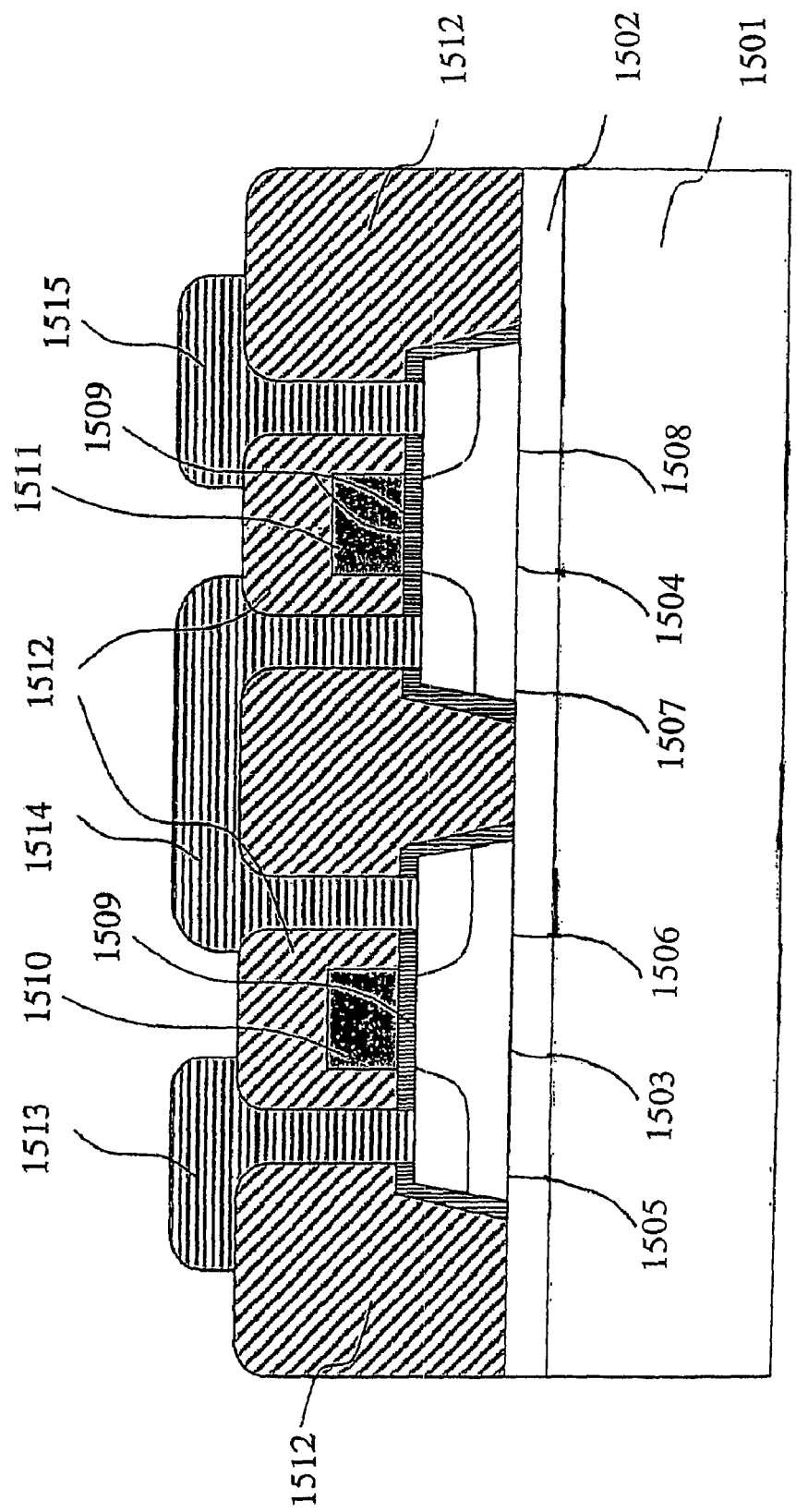
FIG. 16 is a cross-sectional diagram showing the schematic construction of a polysilicon transistor according to a sixth embodiment of the present invention.

FIG. 16 shows an example of a polysilicon TFT formed by the apparatus of FIG. 15, wherein the polysilicon TFT of FIG. 16 has a Si oxide film or a Si nitride film as a gate insulation film. Such a polysilicon TFT is used for driving a liquid crystal display device or organic EL light-emitting device.

First an example that uses a Si oxide film will be explained.

Referring to FIG. 16, the polysilicon TFT is formed on a glass substrate 150 and includes an n-type polysilicon pattern 1503 and a p-type polysilicon pattern 1504 formed on the glass substrate 150 via a Si$_3$N$_4$ film 1502 as a channel layer of an n-MOS TFT and a channel layer of a p-MOS TFT, respectively.

In the channel layer 1503 of the n-MOS TFT, there are formed a source region 1505 and a drain region 1506 of n+-type, while the channel layer 1504 of the p-MOS TFT is formed therein with a source region 1507 and a drain region 1508 of p+-type.

The channel layers 1503 and 1504 are covered by an insulation film 1509, and a polysilicon gate electrode 1510 is formed on the channel layer 1503 via the insulation film 1509. Similarly, a polysilicon gate electrode 1511 is formed on the channel layer 1504 via the insulation film 1509. Further, an insulation film 1512 of SiO$_2$, BSG or BPSG is formed on the Si$_3$N$_4$ film 1502 so as to cover the channel layers 1503 and 1504 and further the gate electrodes 1510 and 1511, and a source electrode 1513 and a drain electrode 1514 are formed on the insulation film 1512 respectively in contact with the source region 1505 and the region 1506. It should be noted that the drain electrode 1514 function also as the source electrode of the p-MOS transistor formed on the channel layer 1504 and thus makes a contact with the source region 1507 via the insulation film 1512. Further, a source electrode 1515 of the p-MOS TFT is formed on the insulation film 1512, wherein the source electrode 1515 makes a contact with the drain region 1508 via the insulation film.

As explained before, a polysilicon film is most stable in the state in which the Si crystals therein are oriented in the <111> direction, in other words, when the <111> direction of the Si crystals points the direction perpendicular to the principal surface of the insulation film. In this state, a dense film having excellent crystal quality is obtained. In the present embodiment, the polysilicon film constituting the channel layers 1503 and 1504 is formed at the temperature of 350° C. with a thickness of 0.2 μm.

In the present embodiment, the insulation film 1509, which is used as the gate insulation film, is formed on the polysilicon film by the foregoing Kr/O$_2$ plasma oxidation processing at the temperature of 400° C. with a thickness of about 30 nm. In the case the insulation film 1509 is formed according to such a process, the problem of thinking of the oxide film 1509 in the corner part of the polysilicon pattern constituting the channel layer 1503 or 1504 is avoided, and a Si oxide film having a uniform thickness is formed over the planar part and also over the edge part.

In the present embodiment, it should be noted that the ion implantation of impurity element for forming the source region or drain region 1505-1508 is conducted without causing the ions to pass through the gate oxide film 1509. The ions thus introduced are activated electrically by conducting a thermal annealing process at 400° C. As a result, the entire process for forming the TFT is conducted at a temperature of 400° C. or less.

In the TFT thus formed, an electron mobility of 300 cm2/V·sec or more or a hole mobility of 150 cm2/V·sec is achieved. Further, it was confirmed that the TFT has a source or drain breakdown voltage and a gate breakdown voltage of 12 V or more. In the case the channel length of the TFT is reduced to 1.5-2.0 μm, it becomes possible to perform a high-speed operation with a speed exceeding 100 MHz. Further, the Si oxide film 1509 thus formed showed excellent results with regard to leakage current characteristic and surface state density at the polysilicon/oxide film interface.

By using the TFT of the present embodiment, a liquid crystal display device or organic EL light-emitting device having the advantageous features of large display area, low cost, high operational speed and high reliability, is realized.

Seventh Embodiment

Figure 17:
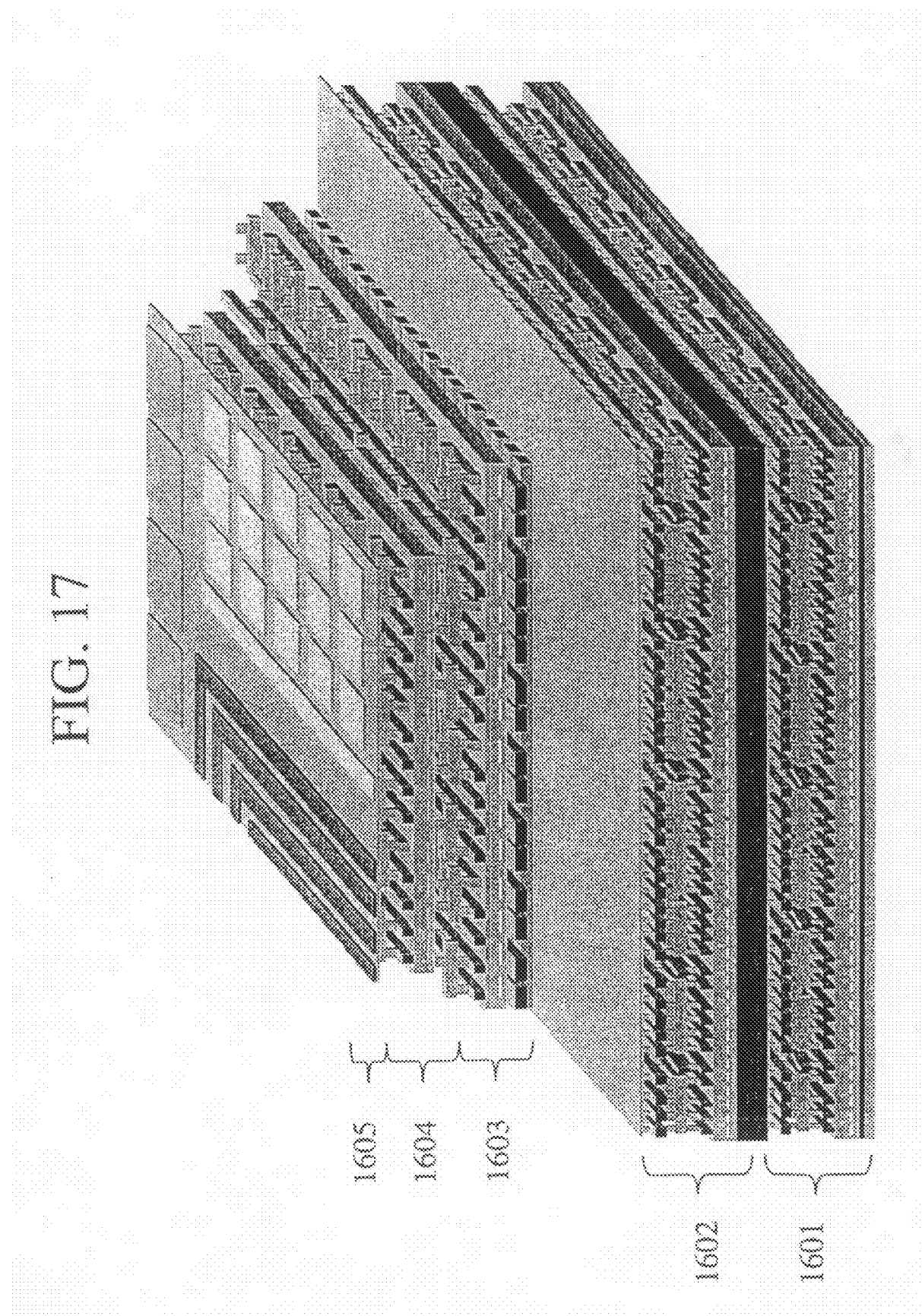
FIG. 17 is a cross-sectional diagram showing the schematic construction of a three-dimensional semiconductor integrated circuit according to a seventh embodiment of the present invention.

FIG. 17 shows the schematic construction of a three-dimensional semiconductor integrated circuit device according to a seventh embodiment of the present invention.

Referring to FIG. 17, the three-dimensional semiconductor integrated circuit has a stacked structure in which a first SOI integrated circuit layer 1601 and a second SOI integrated circuit layer 1602 are stacked with each other, wherein the stacked structure thus formed further carries thereon a first polysilicon semiconductor device layer 1603 and a second polysilicon semiconductor device layer 1604, and an amorphous semiconductor device layer and/or a functional layer 1605 is stacked further on the polysilicon semiconductor device layer 1604.

Each of the first SOI integrated circuit layer 1601 and the second SOI integrated circuit device layer 1602 includes a corresponding interconnection layer, and a digital processing unit, a high-precision high-speed analog unit, a synchronous DRAM unit, a power unit, an interface unit, and the like are formed in each of the layers by the SOI transistor explained with reference to the foregoing fifth embodiment.

Further, the first polysilicon semiconductor device layer 1603 includes a corresponding interconnection layer, and a parallel digital processing unit, an inter-functional block repeater unit, a memory unit, and the like, are formed in the first polysilicon semiconductor device layer 1603 by using the MIS transistor, the ferroelectric memory device, or the flash memory device explained already with reference to first through fourth embodiments.

Further, the second polysilicon semiconductor device layer 1604 includes a corresponding interconnection layer, and there is formed a parallel analog processing unit including an amplifier or A/D conversion unit by using the TFT explained with reference to the sixth embodiment. Further, a functional unit such as an optical sensor, a sound sensor, a touch sensor, a radio transceiver unit, and the like may be formed in the amorphous semiconductor device layer 1605.

The signals formed in the functional unit of the amorphous semiconductor device layer 1605 such as the optical sensor, sound sensor, touch sensor or radio transceiver unit are processed by the parallel analog processing unit in the second polysilicon semiconductor device layer 1604 such as the amplifier or the A/D converter that uses the TFT, and are forwarded further to the parallel digital processing unit or memory unit formed in the first polysilicon device layer 1603 or in the second polysilicon device layer 1604 by using the TFT, the MIS transistor, the ferroelectric memory device or the flash memory device.

The signals thus processed are then processed by the digital processing unit or by the high-precision analog processing unit or the synchronous DRAM unit formed in the first SOI integrated circuit layer 1601 or in the second SOI integrated circuit layer 1602 by using the SOI transistor. Thereby, it should be noted that the inter-functional block repeater unit in the first polysilicon integrated circuit layer 1603 does not occupy a large chip area even when it is provided with plural numbers. Thus, it becomes possible to achieve signal synchronization over the entire integrated circuit device by providing the inter-functional block repeater unit in plural numbers.

It should be noted that such a three-dimensional semiconductor integrated circuit device has become possible as a result of the technology explained before with reference to the embodiments.

It should be noted that the foregoing description is not limited to the (111) surface of the Si crystal but is valid also with a crystal surface near the (111) surface with an offset angle in an arbitrary direction from the (111) surface.

Further, the present invention is not limited to the embodiments described heretofore, but various variations and modifications may be made without departing from the scope of the invention.

What is claimed is:

1. A method of forming a device isolation structure, comprising the steps of:
   forming a device isolation groove defined by a sidewall surface on a surface of a Si substrate;
   depositing an oxide film on said surface of said Si substrate so as to fill said device isolation groove;
   exposing said surface of said Si substrate and a top part of said sidewall surface of said device isolation groove including a top edge of said sidewall surface by an etching process;
   cleaning said exposed surface of said silicon substrate and said top part of said sidewall surface of said device isolation groove including said top edge of said sidewall surface by a cleaning process; and
   oxidizing said exposed surface of said Si substrate and said top part of said device isolation groove including a corner part at said top edge of said sidewall surface of said device isolation groove, to form another oxide film such that said another oxide film covers said surface of said Si substrate and said exposed part of said sidewall surface of said device isolation groove continuously,
   said another oxide film being formed by the steps of:
   forming plasma by exciting an inert gas predominantly of Kr and an oxygen gas by a microwave; and
   oxidizing said surface of said Si substrate and said exposed part of said sidewall surface of said device isolation groove including said corner part by atomic state oxygen O* formed with excitation of said plasma.

* * * * *

UNITED STATES PATENT AND TRADEMARK OFFICE
CERTIFICATE OF CORRECTION

| | |
|---|---|
| PATENT NO. | : 7,795,106 B2 |
| APPLICATION NO. | : 11/907348 |
| DATED | : October 11, 2007 |
| INVENTOR(S) | : Tadahiro Ohmi |

It is certified that error appears in the above-identified patent and that said Letters Patent is hereby corrected as shown below:

On title page, item (73) Assignee replace "Tadahiro Ohmi;Tokyo Electron Limited"

with -- Tadahiro Ohmi --

Signed and Sealed this
Twenty-eighth Day of December, 2010

David J. Kappos
*Director of the United States Patent and Trademark Office*